(12) United States Patent
Sakai

(10) Patent No.: US 8,119,186 B2
(45) Date of Patent: Feb. 21, 2012

(54) LIQUID COATING METHOD AND METHOD FOR MANUFACTURING ORGANIC EL DEVICE

(75) Inventor: Shinri Sakai, Suwa (JP)

(73) Assignee: Seiko Epson Corporation, Tokyo (JP)

(*) Notice: Subject to any disclaimer, the term of this patent is extended or adjusted under 35 U.S.C. 154(b) by 814 days.

(21) Appl. No.: 12/209,571

(22) Filed: Sep. 12, 2008

(65) Prior Publication Data
US 2009/0117261 A1 May 7, 2009

(30) Foreign Application Priority Data
Nov. 6, 2007 (JP) .................................. 2007-288146

(51) Int. Cl.
 B05D 5/06 (2006.01)
 B05D 5/12 (2006.01)
 G05D 7/00 (2006.01)
(52) U.S. Cl. ............... 427/8; 427/64; 427/66; 427/256; 427/427.2; 427/427.3; 700/283
(58) Field of Classification Search .............. 427/8, 64, 427/66, 256, 427.2, 427.3; 700/117, 123, 700/283
See application file for complete search history.

(56) References Cited

U.S. PATENT DOCUMENTS
2007/0109606 A1* 5/2007 Nagae .......................... 358/3.26

FOREIGN PATENT DOCUMENTS
| JP | A-2003-249355 | 9/2003 |
| JP | A-2005-193104 | 7/2005 |
| JP | 2007136310 A * | 6/2007 |

* cited by examiner

Primary Examiner — Leo B Tentoni
(74) Attorney, Agent, or Firm — Oliff & Berridge, PLC

(57) ABSTRACT

Droplets of a liquid are ejected through a plurality of nozzles to a plurality of coating regions on a substrate based on nozzle information including the ejection amount of a droplet of the liquid ejected through each nozzle. According to arrangement information for disposing the liquid, a plurality of droplet groups are disposed in each coating region while the plurality of nozzles and the substrate are scanned for relative movement. A calculation is performed according to the nozzle information and the arrangement information. Adjustment amount is calculated so that the assigned adjustment amounts vary from one droplet group to another. Driving signals, which drive selected nozzles, are set so that combinations of the driving signals give coating amounts that have taken the assigned adjustment amounts into account.

20 Claims, 17 Drawing Sheets

FIG. 1

(TABLE 1)

| Gr1 ADJUSTMENT LEVEL \ Gr2 ADJUSTMENT LEVEL | $0 \times \Delta q_2$ | $1 \times \Delta q_2$ | $2 \times \Delta q_2$ $\Big\} Gr_1+Gr_2$ |
|---|---|---|---|
| $0 \times \Delta q_1$ | 0 | $0 \times \Delta q_1 + 1 \times \Delta q_2$ | $0 \times \Delta q_1 + 2 \times \Delta q_2$ |
| $1 \times \Delta q_1$ | $1 \times \Delta q_1 + 0 \times \Delta q_2$ | $1 \times \Delta q_1 + 1 \times \Delta q_2$ | $1 \times \Delta q_1 + 2 \times \Delta q_2$ |
| $2 \times \Delta q_1$ | $2 \times \Delta q_1 + 0 \times \Delta q_2$ | $2 \times \Delta q_1 + 1 \times \Delta q_2$ | $2 \times \Delta q_1 + 2 \times \Delta q_2$ |

FIG. 2

(TABLE 2) $\Delta q_1 = 1, \Delta q_2 = 3 \Delta q_1$

| Gr1 ADJUSTMENT LEVEL \ Gr2 ADJUSTMENT LEVEL | 0 | 3 | 6 $\Big\} Gr_1+Gr_2$ |
|---|---|---|---|
| 0 | 0 | 3 | 6 |
| 1 | 1 | 4 | 7 |
| 2 | 2 | 5 | 8 |

FIG. 3

(TABLE 3)   $\Delta q_1 = 1, \Delta q_2 = 2\Delta q_1$

| Gr1 ADJUSTMENT LEVEL \ Gr2 ADJUSTMENT LEVEL | 0 | 2 | 4 |
|---|---|---|---|
| 0 | 0 | 2 | 4 |
| 1 | 1 | 3 | 5 |
| 2 | 2 | 4 | 6 |

The last three columns correspond to $Gr_1 + Gr_2$.

FIG. 4

(TABLE 4)   $\Delta q_1 = 1, \Delta q_2 = 2.4\Delta q_1$

| Gr1 ADJUSTMENT LEVEL \ Gr2 ADJUSTMENT LEVEL | 0 | 2.4 | 4.8 |
|---|---|---|---|
| 0 | 0 | 2.4 | 4.8 |
| 1 | 1 | 3.4 | 5.8 |
| 2 | 2 | 4.4 | 6.8 |

The last three columns correspond to $Gr_1 + Gr_2$.

FIG. 5

(TABLE 5) $\Delta q_1 = \pm 1, \Delta q_2 = \pm 3$

| $Gr_1$ ADJUSTMENT LEVEL \ $Gr_2$ ADJUSTMENT LEVEL | −3 | 0 | +3 |
|---|---|---|---|
| −1 | −4 | −1 | +2 |
| 0 | −3 | 0 | +3 |
| +1 | −2 | 1 | +4 |

(TABLE 6) $\Delta q_1 = 1, \Delta q_2 = \Delta q_1$

| $Gr_1$ ADJUSTMENT LEVEL \ $Gr_2$ ADJUSTMENT LEVEL | 0 | 1 | 2 |
|---|---|---|---|
| 0 | 0 | 1 | 2 |
| 1 | 1 | 2 | 3 |
| 2 | 2 | 3 | 4 |

$Gr_1 + Gr_2$

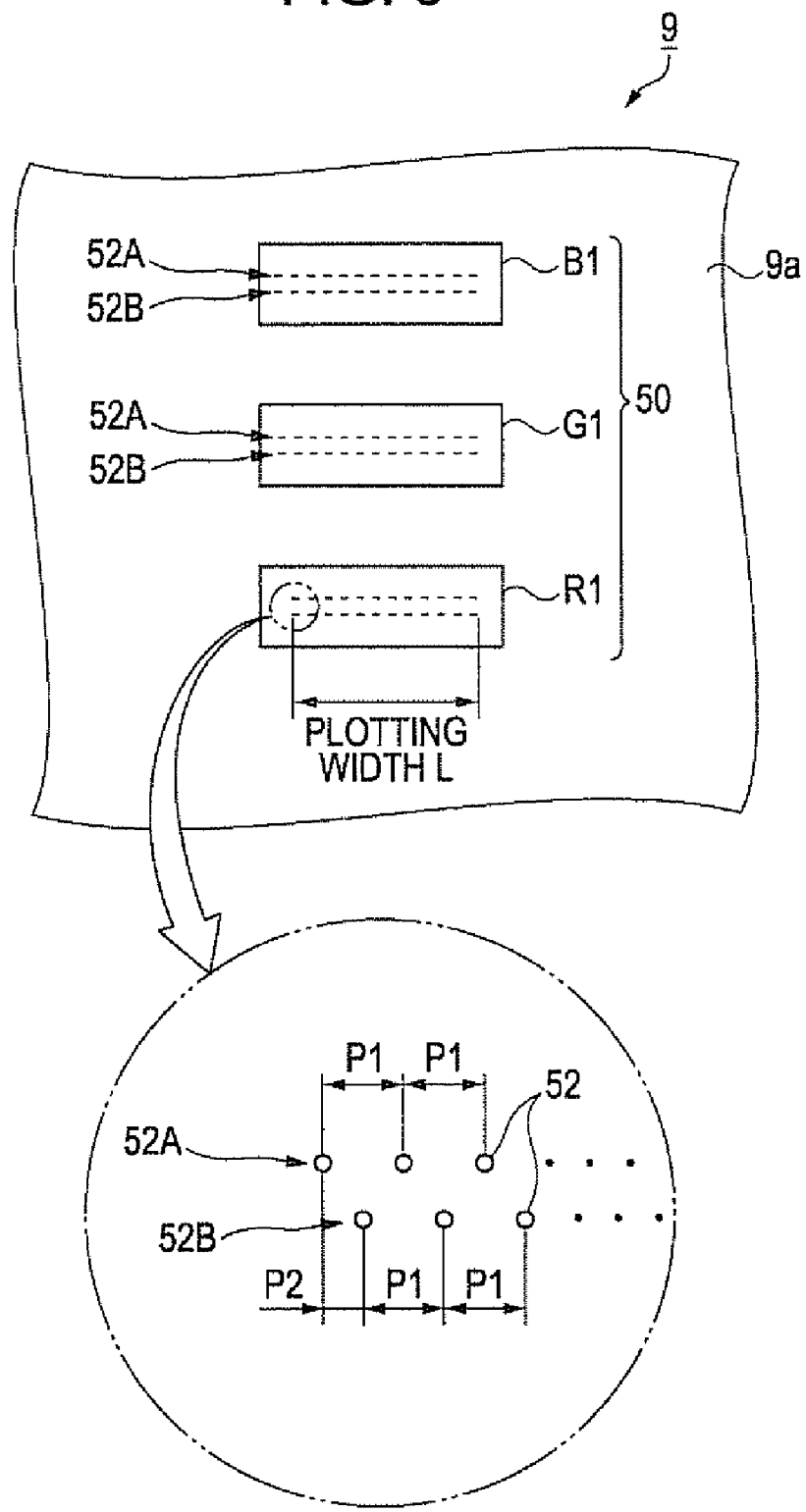

FIG. 15

| SECTION | RANGE OF COATING AMOUNT (ng) | TYPICAL VALUE (ng) | ADJUSTMENT AMOUNT (ng) |
|---|---|---|---|
| 9 | 32.3 < Q ≤ 33.0 | 32.7 | −2.7 |
| 8 | 31.7 < Q ≤ 32.3 | 32.0 | −2.0 |
| 7 | 31.0 < Q ≤ 31.7 | 31.3 | −1.3 |
| 6 | 30.3 < Q ≤ 31.0 | 30.7 | −0.7 |
| 5 | 29.7 < Q ≤ 30.3 | 30.0 | 0 |
| 4 | 29.0 < Q ≤ 29.7 | 29.3 | 0.7 |
| 3 | 28.3 < Q ≤ 29.0 | 28.7 | 1.3 |
| 2 | 27.7 < Q ≤ 28.3 | 28.0 | 2.0 |
| 1 | 27.0 ≤ Q ≤ 27.7 | 27.3 | 2.7 |

FIG. 16

| SECTION | ADJUSTMENT AMOUNT (ng) | ADJUSTMENT AMOUNT OF FIRST DROPLET GROUP (ng) | ADJUSTMENT AMOUNT OF SECOND DROPLET GROUP (ng) |
|---|---|---|---|
| 9 | −2.7 | −2.0 | −0.7 |
| 8 | −2.0 | −2.0 | 0 |
| 7 | −1.3 | −2.0 | 0.7 |
| 6 | −0.7 | 0 | −0.7 |
| 5 | 0 | 0 | 0 |
| 4 | 0.7 | 0 | 0.7 |
| 3 | 1.3 | 2.0 | −0.7 |
| 2 | 2.0 | 2.0 | 0 |
| 1 | 2.7 | 2.0 | 0.7 |

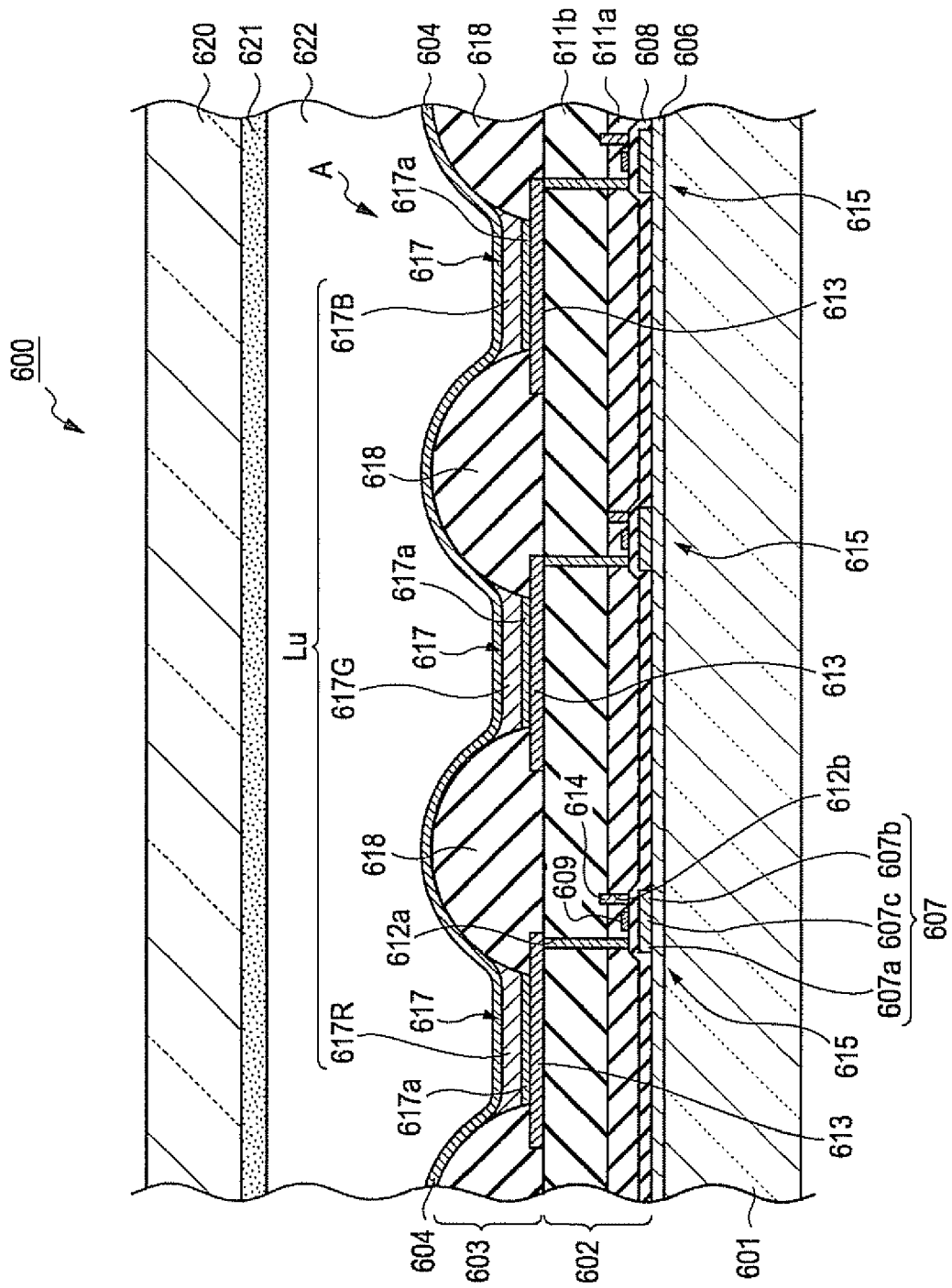

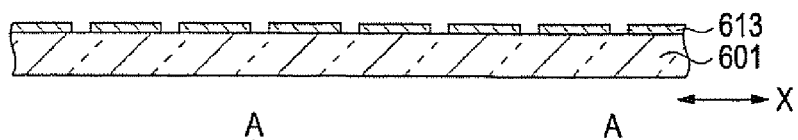
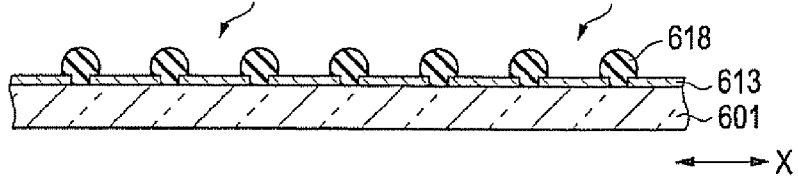
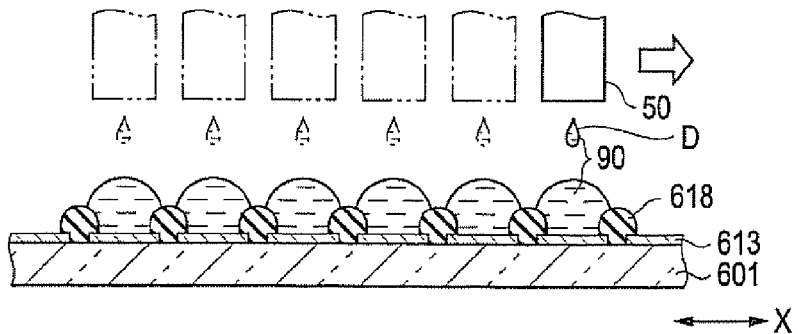
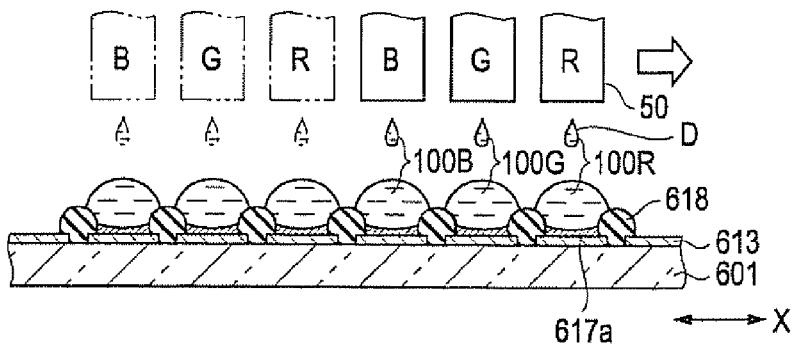
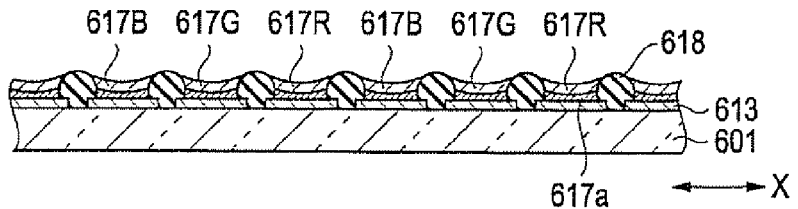
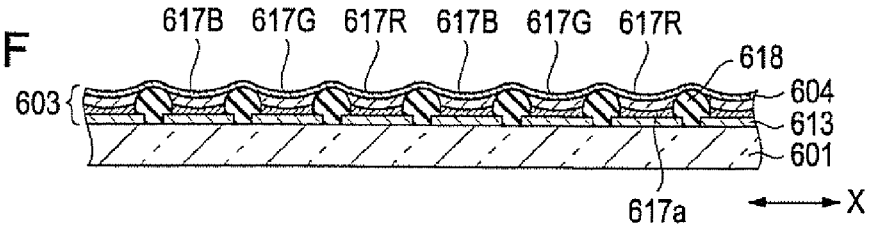

LIQUID COATING METHOD AND METHOD FOR MANUFACTURING ORGANIC EL DEVICE

BACKGROUND

1. Technical Field

The present invention relates to a liquid coating method and a method for manufacturing an organic EL device.

2. Related Art

A liquid coating methods is described in a method for manufacturing a display device in which at least one of a plurality of function layers disposed between electrodes is formed by ejecting a liquid as droplets through a plurality of nozzles of a liquid ejecting head and the liquid ejecting head is scanned so that different nozzles eject droplets onto each region corresponding to the electrodes (Japanese Unexamined Patent Application Publication No. 2003-249355).

Since the liquid is ejected through different nozzles in this method, the variations in ejection amount among nozzles can be canceled. Consequently, the variation in amount of composition disposed between the electrodes is reduced.

Another liquid coating method is described in a method for controlling an ejection apparatus (Japanese Unexamined Patent Application Publication No. 2005-193104). The control method includes the first step of ejecting a viscous liquid from a head including a plurality of nozzles through which the viscous liquid is ejected and a plurality of pressure generating elements provided for the respective nozzles. A reference driving pulse is applied to each pressure generating element, thereby ejecting the viscous liquid through the nozzles. In a second step, the plurality of nozzles are divided into a plurality of groups according to the results of measurement for the weight of viscous liquid ejected through the nozzle, and a driving pulse having a waveform according to the group is applied to pressure generating elements corresponding to the nozzles in the group, thus ejecting the viscous liquid.

In the display device manufacturing method, the number of sequences of liquid ejecting head scanning is increased for aligning the positions of the different nozzles with each of the regions, in comparison with the case in which a single nozzle ejects liquid. This method is thus disadvantageous in increasing the productivity of liquid coating.

In the ejection apparatus controlling method, the number of driving pulses according to the weight of liquid ejected through the nozzle is increased as the number of nozzles is increased. Consequently, the driving circuit that generates the drive pulses to apply the pressure generating elements is undesirably complicated.

SUMMARY

An advantage of some aspects of the invention is to solve the above-described disadvantages.

According to an aspect of the invention, a liquid coating method is provided which is performed by ejecting droplets of a liquid through a plurality of nozzles to a plurality of coating regions on a substrate. In the method, nozzle information is obtained. The nozzle information includes the ejection amount of a droplet of the liquid ejected through each nozzle. Arrangement information for disposing the liquid is produced. According to the arrangement information, a plurality of droplet groups each including at least one droplet of the liquid are disposed in each coating region while the plurality of nozzles and the substrate are scanned for relative movement. Operation for calculating the coating amount of the liquid to be applied to each coating region is performed according to the nozzle information and the arrangement information. The variation in coating amount is divided into a plurality of sections. The difference between a typical value of each section and a predetermined coating amount is calculated, and the difference is set as the adjustment amount adjusted from the predetermined coating amount in the corresponding section. The adjustment amount of each of the sections requiring adjustment is assigned the droplet groups so that the assigned adjustment amounts vary from one droplet group to another. A plurality of driving signals for each droplet groups are set so that combinations of the driving signals give coating amounts that have taken the assigned adjustment amounts into account. A selected nozzle is driven with driving signals selected from the combinations to eject the liquid to each of the coating regions through the nozzle while the scanning is performed according to the arrangement information.

When a liquid is applied as droplets to each coating region using different nozzles having variations in droplet ejection amount of droplet, the coating amount of the liquid applied to each coating region is also varied. In order to reduce the variation in coating amount, the driving signals driving the nozzles may be adjusted for the respective nozzles. However, this makes complicated the driving circuit that produces driving signals according to the number of the nozzles or applies the driving signals to the nozzles.

In the method according to the embodiment, the liquid to be applied to the coating region is constituted of a plurality of droplet groups, and the coating amount for each coating region is calculated according to the nozzle information and the arrangement information. Consequently, the variation in coating amount can be estimated.

The variation in coating amount (total amount of droplets of the droplet groups) is divided into a plurality of sections. The adjustment amount adjusted from a predetermined coating amount is determined for each section, and the adjustment amount is assigned to the droplet groups so that the assigned adjustment amounts vary from one droplet group to another.

A plurality of driving signals are set for each droplet groups so that combinations of the driving signals give coating amounts that have taken the assigned adjustment amounts into account. Accordingly, the number of driving signals for applying the liquid can be reduced in comparison with the case in which the nozzles are driven with driving signals adjusted for the respective nozzles.

For obtaining the adjustment amount in each coating region, the variation in coating amount is divided into a plurality of sections, the difference between a typical value of each section and a predetermined coating amount is calculated. The difference is set as the adjustment amount. Thus, the actual coating amount is adjusted so as to be close to the predetermined coating amount, and the variation in coating amount applied to the coating regions can be small than the variation in ejection amount of the droplet ejected through each nozzle.

Preferably, one of the plurality of driving signals is defined as a reference driving signal, and the predetermined coating amount is obtained by multiplying a reference ejection amount of droplet ejected with the reference driving signal and the total number of droplets of the plurality of droplet groups. Also, the nozzle information includes the ejection amounts of the plurality of nozzles driven with the reference driving signal.

Thus, the predetermined coating amount is determined according to the reference ejection amount when the nozzles are driven with the reference driving signal. Accordingly, the variation in coating amount can be reduced while the variation in ejection amount of the droplet elected through the nozzles is taken into account.

Preferably, the arrangement information is produced so that the respective droplet groups are disposed by different sequences of the scanning.

Since the liquid is ejected according to the arrangement information, the droplet groups are ejected by the respective sequences of scanning. Consequently, the nozzles used for ejection can be driven with a single combination of driving signals in the same scanning sequence. Accordingly, the nozzles can be operated under stable driving conditions in each sequence of scanning. Thus, the variation in coating amount can further be reduced.

The arrangement information may be produced so that the respective droplet groups are disposed using the same nozzle by the different sequences of the scanning.

Since the plurality of droplet groups are ejected to each coating region through the same nozzle, the liquid can efficiently be applied without performing such complicated scanning of the nozzles and the substrate as nozzles are changed. Also, since the same nozzle is used, the jetting performance of the nozzle can be constant. Accordingly, stable ejection can be performed.

The arrangement information may be produced so that the droplet groups are disposed by the different sequence of the scanning, using different nozzles for the respective droplet groups or the respective droplets.

Thus, the droplet groups can be defined with the variation in ejection amount among nozzles dispersed in each coating region. Accordingly, the variation in coating amount can be further reduced.

The plurality of nozzles may define a plurality of nozzle lines. In such a case, the scanning is performed so as to relatively move the nozzle lines and the substrate, and the arrangement information may be produced so that the respective droplet groups are disposed using the same nozzle line by different sequences of the scanning.

This allows the plurality of droplet groups to be ejected to each coating region using the same nozzle line. Since the same droplet group applied to a plurality of coating regions is adjusted using the nozzles in the same nozzle line, which can exhibit the same jetting performance, precise and uniform adjustment can be performed over the plurality of coating regions. Thus, the variation in coating amount can further be reduced.

The scanning may be performed so as to relatively move a plurality of ejection heads having the plurality of nozzles and the substrate, and the arrangement information may be produced so that the respective droplet groups are disposed using the same ejection head by different sequences of the scanning.

This allows the plurality of droplet groups to be ejected to each coating region from the same ejection head. Since the same droplet group applied to a plurality of coating regions is adjusted using the nozzles in the same ejection head exhibiting the same jetting performance, precise and uniform adjustment can be performed over the plurality of coating regions. Thus, the variation in coating amount can further be reduced.

Preferably, the plurality of sections have the same range.

Since the variation in coating amount applied to a plurality of coating regions is divided into sections having the same range, the adjustment of the coating amount can be even without bias depending on the section.

The variation in coating amount is divided into sections so that the range of variations in coating amount corresponds to the range of the plurality of sections.

The variation in coating amount results from the variation in ejection amount among nozzles. The droplet groups adjusted by this technique can result in a variation in coating amount smaller than the variation in ejection amount among nozzles.

The variation in coating amount may be divided into sections so that the maximum value and the minimum value in the variation in coating amount are the typical values of the sections.

Since the adjustment amount is defined by the deference between the typical value in the corresponding section and the predetermined coating amount, the droplet groups can be more appropriately adjusted for the maximum and minimum values in the variation in coating amount.

The predetermined coating amount may be defined by the median of the variation in coating amount, and the section including the median is selected as the target of the adjustment, thus setting the adjustment amount in each section.

This allows positively and negatively symmetrical adjustment whose center is the section including the median in combination of positive adjustment that increases the coating amount and negative adjustment that reduces the coating amount. Thus, the variation in coating amount can be narrowed in the range of the section including the median.

For assigning the adjustment amount, preferably, a plurality of adjustment levels may be assigned to each droplet groups according to the combinations of the plurality of driving signals, and the plurality of adjustment levels are varied at the same intervals for each droplet group.

Since the assigned adjustment intervals have the same for each droplet group, uniform adjustment can be performed for each droplet group.

One of the droplet groups may be defined as a reference droplet group that is the reference of the adjustment, and the interval of the adjustment levels of each of the other droplet groups is twice or more of the interval of the reference droplet group.

This can reliably reduce the probability producing the same combination at the level of coating amounts of the droplet groups obtained by combinations of a plurality of adjustment levels. Thus, much adjustment levels of the coating amount can be produced.

The product of the interval of the adjustment levels in the reference droplet group and the number of the adjustment levels of the reference droplet group may be equal to the interval of the adjustment levels of another droplet group.

Thus, the adjustment intervals of other droplet groups can be expressed by a geometric progression with respect to the reference droplet group. Accordingly, a plurality of droplet group are linked to each other and thus consistent adjustment in coating amount can be performed.

The droplet group constituted of the smallest number of droplets may be defined as the reference droplet group.

Thus, the rate of adjustment among the droplet groups can be leveled on the basis of the number of droplets. Hence, precise adjustment can be performed with a small error.

The droplet group constituted of droplets having a smallest droplet amount may be defined as the reference droplet group.

Thus, the rate of adjustment among the droplet groups can be leveled on the basis of the droplet amount. Hence, precise adjustment can be performed with a small error.

The number of adjustment levels of the reference droplet group may be the same as the number of adjustment levels of the other droplet groups.

Thus, the same number of adjustment levels can be given for each droplet group. The coating amount according to the combinations of these adjustment levels can have much adjustment levels, and accordingly, more precise adjustment can be performed.

The number of adjustment levels of each droplet group may be the same as the number of the plurality of driving signals.

Since the number of adjustment levels are given by a plurality of driving signals, consistent adjustment in coating amount can be performed for each droplet group using the plurality of driving signals.

According to another aspect of the invention, there is provides a method for manufacturing an organic EL device including luminescent layers in a plurality of luminescent layer-forming regions separated one another on a substrate. The method includes applying a liquid containing a luminescent layer material to the luminescent layer-forming regions. The liquid is applied as a plurality of droplet groups to each luminescent layer-forming region by the liquid coating method as set forth in Claim 1. The method also includes solidifying the applied liquid to form the luminescent layers.

In the method, the liquid containing a luminescent layer material can be applied to each luminescent layer-forming region with a small variation from a predetermined coating amount. Accordingly, the resulting luminescent layers have small variation in thickness. Consequently, unevenness in emission and brightness resulting from the uneven thickness are reduced, and thus the resulting organic EL device exhibits stable light emitting performance.

For applying the liquid, a plurality of liquids that can produce different color emissions including red, green, and blue emissions may be each applied to desired luminescent layer-forming regions so that the luminescent layers include at least red, green, and blue luminescent layers.

Thus, at least three color luminescent layers of red, green, and blue are formed, and the resulting organic EL device can achieve full-color light emission.

BRIEF DESCRIPTION OF THE DRAWINGS

The invention will be described with reference to the accompanying drawings, wherein like numbers reference like elements.

FIG. 1 is a table for a fundamental liquid coating method.

FIG. 2 is a table for a liquid coating method according to an embodiment of the invention.

FIG. 3 is a table for a liquid coating method according the embodiment of the invention.

FIG. 4 is a table for a liquid coating method according to the embodiment of the invention.

FIG. 5 is a table for a liquid coating method according to the embodiment of the invention.

FIG. 6 is a table for a liquid coating method according to a known technique.

FIG. 9 is a schematic plan view of the arrangement of an ejection head of a head unit.

FIG. 15 is a table showing the range of coating amounts and the adjustment amount, in each section.

FIG. 16 is a table showing the adjustment amounts of respective droplet groups and their total adjustment amount, for each section.

FIG. 17 is a schematic sectional view of an organic EL device.

FIGS. 20A to 20F are schematic sectional views of the method for preparing the light-emitting element portion.

DESCRIPTION OF EXEMPLARY EMBODIMENTS

Figure 7:
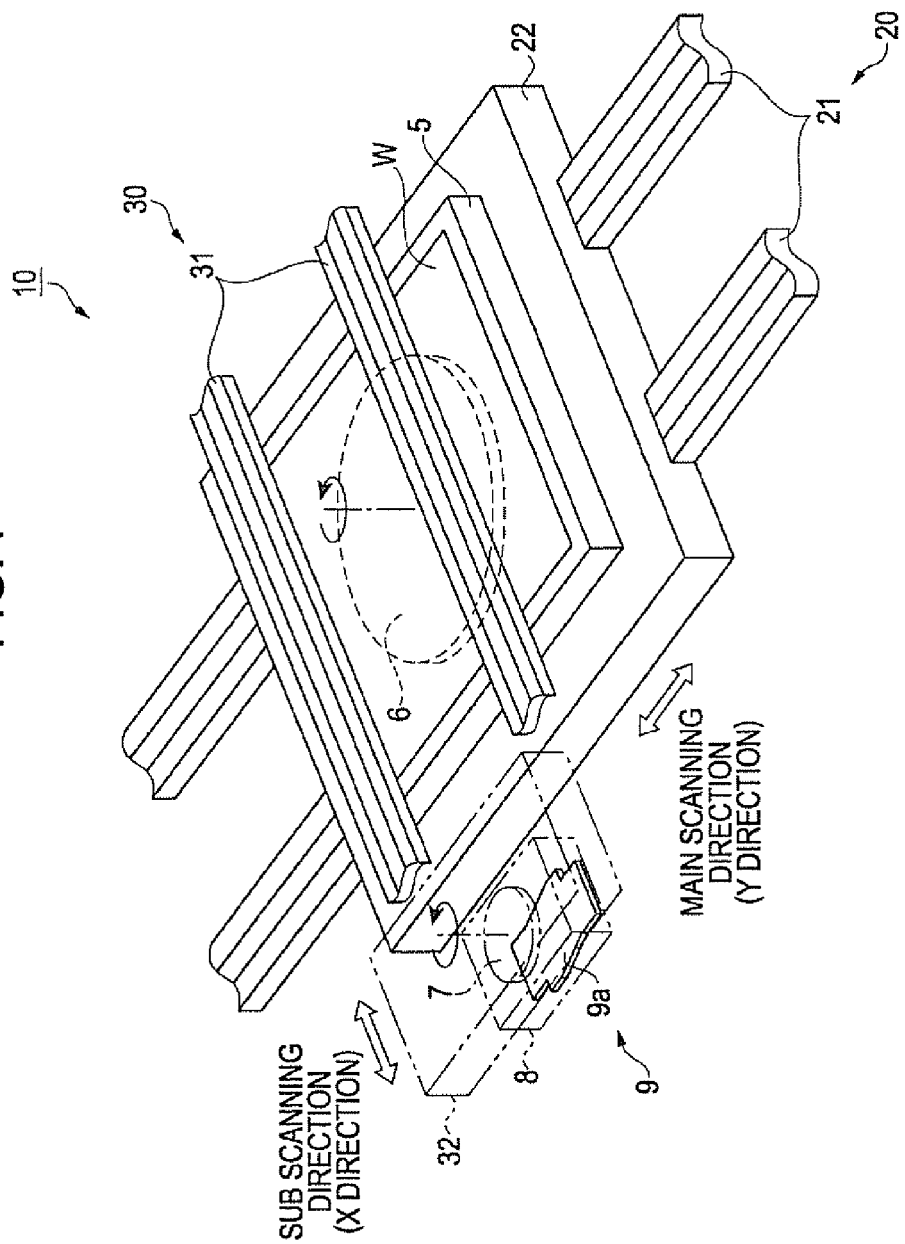
FIG. 7 is a perspective view of a liquid ejection apparatus according to an embodiment of the invention.

The invention will now be described using embodiments with reference to the drawings.

First Embodiment

Liquid Coating Method

The fundamental concept of the liquid coating method according to the present embodiment will first be described. The liquid coating method of the present embodiment is applied to the cases in which a plurality of (m) droplet groups Gr ($Gr_1$, $Gr_2$, $Gr_3$, ..., $Gr_m$) of a liquid (for example, ink) are applied to a coating region by a liquid ejection method (for example, ink jet method). The droplet groups Gr ($Gr_1$, $Gr_2$, $Gr_3$, ... $Gr_m$) each include at least one droplet of the liquid. When the ejection amounts (or droplet amounts) of the droplet groups $Gr_1$ to $Gr_m$ are $q_1$ to $q_m$, respectively, the total amount (coating amount) Q of the liquid applied to a single coating region is obtained from equation (1):

$$Q = \sum_{i=1}^{m} q_i \quad (1)$$

For ejecting droplets of a liquid onto a coating region, a liquid ejection apparatus 10 shown in FIG. 7, which will be described later, is used. The liquid ejection apparatus 10 can adjust the reference droplet amount q of a droplet group Gr at n levels varied at regular intervals Δq. In other words, the droplet amount can be selected from the adjustment levels: q, q+Δq, q+2Δq, and q+3Δq to q+(n−1)Δq. Thus, the droplet amounts of the droplet groups $Gr_1$ to $Gr_m$ can be adjusted at a plurality of (n) levels.

For the sake of easy understanding, assume that two droplet groups $Gr_1$ and $Gr_2$ of a liquid are disposed to a single coating region.

FIG. 1 is a table (Table 1) showing the adjustment levels of droplet groups $Gr_1$ and $Gr_2$ in a fundamental liquid coating method. As shown in Table 1 (FIG. 1), the droplet amount of droplet group $Gr_1$ is adjusted at three levels of 0 to 2 according to an adjustment interval $\Delta q_1$. The droplet amount of droplet group $Gr_2$ is also adjusted at three levels of 0 to 2 according to another adjustment interval $\Delta q_2$ as well. The total coating amount of the liquid constituted of droplet groups $Gr_1$ and $Gr_2$ can be adjusted at nine levels according to the combinations of the adjustment levels of the two droplet groups.

In the present embodiment, $0 \times \Delta q_1$, $1 \times \Delta q_1$, and $2 \times \Delta q_1$ are the adjustment amounts of droplet group $Gr_1$ at the respective adjustment levels. Adjustment level 0 means that the reference droplet amount of a droplet group is ejected to the coating region. In other words, it is not necessary to adjust the droplet amount of the droplet group. The same applies to $0 \times \Delta_2$, $1 \times \Delta q_2$, and $2 \times \Delta q_2$. In the present embodiment, hence, the adjustment interval $\Delta q_1$ of droplet group $Gr_1$ and the adjustment interval $\Delta q_2$ of droplet group $Gr_2$ are set different from each other.

In such a liquid coating method, in which the adjustment intervals $\Delta q_1$ and $\Delta q_2$ differ, at most 5 driving signals are required to vary the droplet ejection amount, including a reference driving signal for ejecting a reference amount of droplet. In other words, the coating amount of the liquid can be adjusted at nine levels by ejecting droplets using the combinations of the five driving signals.

In addition, when the number of droplets (ejections) of droplet groups $Gr_1$ and $Gr_2$ are, for example, 1 and 3, respectively; the numbers of adjustment levels of droplet groups $Gr_1$ and $Gr_2$ are each 3; and thus the same driving signal is applied, the droplet amount of droplet group $Gr_2$ is three times of the droplet amount of droplet group $Gr_1$. Hence, when the ratio between the number of droplets of droplet group $Gr_1$ and the number of droplets of droplet group $Gr_2$ is the same as the number of adjustment levels of each droplet group, the same driving signal can be used. Thus, the number of driving signals can be reduced.

Such a liquid coating method is involved in how the driving signal is produced. The method will be further described with reference to the following cases.

FIG. 2 (Table 2) shows a liquid coating method in which a plurality of adjustment levels are prepared for each of the droplet groups $Gr_1$ and $Gr_2$. The adjustment levels are normalized on the basis of the adjustment interval $\Delta q_1$ of droplet group $Gr_1$ and the adjustment interval $\Delta q_2$ of droplet group $Gr_2$ is set to an integral multiple (three times, in the case shown in Table 2) of the adjustment interval $\Delta q_1$ of droplet group $Gr_1$. More specifically, the adjustment interval $\Delta q_2$ of droplet group $Gr_2$ is set so that $\Delta q_2 = 3\Delta q_1$ holds. Hence, when $\Delta q_1 = 1$, $\Delta q_2 = 3$ holds.

Consequently, as shown in Table 2, the total amount of the liquid (coating amount) Q can be adjusted at Level 0, at which droplet groups $Gr_1$ and $Gr_2$ are each constituted of droplets ejected with a reference driving signal (that is, droplet groups $Gr_1$ and $Gr_2$ are each constituted of droplets ejected in a reference ejection amount), and another eight levels are varied at regular intervals: $\Delta q_1$, $2\Delta q_1$, $3\Delta q_1$, $4\Delta q_1$, $5\Delta q_1$, $6\Delta q_1$, $7\Delta q_1$, and $8\Delta q_1$. Hence, the coating amount of the liquid can be adjusted at nine levels, including Level 0. Accordingly, five driving signals adjusted from the reference driving signal are produced on the basis of the adjustment interval $\Delta q_1$ of droplet group $Gr_1$, or three driving signals are produced if the ratio between the numbers of droplets of droplet groups $Gr_1$ and $Gr_2$ is the same as the number of the adjustment levels. In this method shown in Table 2, the coating amount is adjusted so that the droplet amount of droplet group $Gr_2$ is increased with respect to the droplet amount of droplet group $Gr_1$.

FIG. 3 (Table 3) shows a liquid coating method different from the case shown in Table 2 in that the adjustment interval $\Delta q_2$ of droplet group $Gr_2$ is set to an integral multiple (two times, in the case shown in Table 3) of the adjustment interval $\Delta q_1$ of droplet group $Gr_1$. More specifically, adjustment interval $\Delta q_2$ of droplet group $Gr_2$ is set so that $\Delta q_2 = 2\Delta q_1$ holds. Hence, when $\Delta q_1 = 1$, $\Delta q_2 = 2$ holds.

Consequently, as shown in Table 3, the total amount of the liquid (coating amount) Q can be adjusted at seven levels from 0 to 6 varied at regular intervals of 1 because some combinations of the adjustment levels of the two groups $Gr_1$ and $Gr_2$ are equivalent. Although the number of the possible adjustment levels is reduced by two levels from that in the case shown in Table 2, the coating amount of the liquid can be adjusted at a larger number of adjustment levels by one level than the total number of the adjustment levels of droplet groups $Gr_1$ and $Gr_2$. The number of driving signals is the same as the case shown in Table 1, but the adjustment interval of the coating amounts is of course reduced.

FIG. 4 (Table 4) shows a liquid coating method in which the adjustment interval $\Delta q_2$ of droplet group $Gr_2$ is set to a non-integral multiple of the adjustment interval $\Delta q_1$ of droplet group $Gr_1$, for example, adjustment interval $\Delta q_2 = 2.4 \Delta q_1$. When $\Delta q_1 = 1$, $\Delta q_2 = 2.4$ holds. More specifically, when the adjustment interval $\Delta q_2$ of droplet group $Gr_2$ is between the values shown Tables 2 and 3, the coating amount of the liquid can be adjusted at precision of 1 or less as shown in Table 4. While the number of possible adjustment levels is the same as the case shown in Table 2, the adjustment interval of each droplet group is irregular. In other words, the coating amount can be adjusted at irregular intervals (non-integral multiple)

FIG. 5 (Table 5) shows a liquid coating method in which the coating amount is positively or negatively adjusted on the basis of level 0. For example, the adjustment interval $\Delta q_1$ of droplet group $Gr_1$ is set in the range of ±1 including 0, and the adjustment interval $\Delta q_2$ of droplet group $Gr_2$ is set to three times of the adjustment interval $\Delta q_1$, that is, in the range of ±3 including 0. The numbers of adjustment levels of droplet groups $Gr_1$ and $Gr_2$ are each three, as in the case shown in Table 2.

Consequently, the total amount Q of the liquid can be positively or negatively adjusted by $\pm \Delta q_1$, $\pm 2\Delta q_1$, $\pm 3\Delta q_1$, and $\pm 4\Delta q_1$ from the amount of level 0, as shown in Table 5. Thus, the plurality of driving signals include adjustment driving signals for positively and negatively symmetrical adjustments.

While in the cases shown in Tables 2 to 5, the numbers of adjustment levels of the droplet groups $Gr_1$ and $Gr_2$ are each three, odd number, the number of adjustment levels may be an even number. In this instance, however, positively and negatively symmetrical adjustment as shown in Table 5 is not allowed. In other words, positively and negatively asymmetrical adjustment becomes possible.

FIG. 6 (Table 6) shows a liquid coating method not according to the embodiment of the invention. In this case, the adjustment interval $\Delta q_1$ of droplet group $Gr_1$ is set equal to the adjustment interval $\Delta q_2$ of droplet group $Gr_2$. For example, the adjustment intervals are set so that $\Delta q_1 = \Delta q_2 = 1$ holds.

Consequently, partially equivalent combinations (combinations of equivalent adjustment levels) occur more than in the cases shown in Tables 2 to 5, and accordingly the total amount (coating amount) Q of the liquid is adjusted at a smaller number of adjustment levels than the sum of the numbers of the adjustment levels of the droplet groups $Gr_1$ and $Gr_2$, as shown in Table 6.

The most preferred method of the cases shown in Tables 2 to 5 is that in which the amounts of m droplet groups ($Gr_1$ to $Gr_m$) are adjusted at n adjustment levels ($n_1$ to $n_m$) varied at regular adjustment intervals of $\Delta q$ ($\Delta q_1$ to $\Delta q_m$). In addition, the respective adjustment intervals $\Delta q_1$ to $\Delta q_m$ of the m droplet groups differ from one another. For example, the adjustment intervals are set so that $\Delta q_1 < \Delta q_2 < \Delta q_3 < \ldots < \Delta q_m$ holds. Let the adjustment interval of a droplet group Gr be expressed by $N \times \Delta q$. N is an integer selected from among 0 to n−1, and the respective numbers of the adjustment levels of the droplet groups $Gr_1$ to $Gr_m$ are the same. Thus, the coating amount of the liquid constituted of droplet groups $Gr_1$ to $Gr_m$ can be expressed by an m-digit number $N_m N_{m-1} \ldots N_2 N_1$. Also, the adjustment intervals are set so as to be expressed by a geometric progression, such as adjustment interval $\Delta q_2 = n \times$ adjustment interval $\Delta q_1$, adjustment interval $\Delta q_3 = n \times \Delta q_2, \ldots, \Delta q_m = n \times \Delta q_{m-1}$, so that the adjustment of the coating amount of the liquid can be expressed by n-ary $(N_m N_{m-1}, \ldots, N_2 N_1)$. The total adjustment amount at that time is expressed by multiplying the n-ary number by the minimum adjustment interval $\Delta q_1$. The total coating amount can be adjusted at nm levels varied at regular adjustment intervals $\Delta q_1$. Such conditions allow the coating amount to be adjusted at the largest number of levels varied at regular intervals.

If the number of the adjustment levels are not the same among droplet groups $Gr_1$ to $Gr_m$, the adjustment intervals are set so as to be $\Delta q_2 = n_1 \times \Delta q_1$, $\Delta q_3 = n_2 \times \Delta q_2, \ldots, \Delta q_m = n_{m-1} \times \Delta q_{m-1}$. Thus, the total coating amount can be adjusted at $n_m \times n_{m-1} \times \ldots \times n_2 \times n_1$ levels varied at regular adjustment intervals $\Delta q_1$.

The liquid coating method of the first embodiment produces the following effects:

The droplet groups Gr constituting the liquid are each given a plurality of number of (n) adjustment levels varied at regular adjustment intervals $\Delta q$ different from the adjustment intervals of the other droplet groups. The coating amount (total amount Q) of the liquid can be adjusted by combinations of the adjustment levels. The adjustment interval $\Delta q$ is obtained by selecting one of a plurality of driving signals including a reference driving signal and adjustment driving signals. Accordingly, the adjustment can be performed at a larger number of adjustment levels than the number of the driving signals. Also, by setting the adjustment interval $\Delta q$ to an integral multiple of the minimum adjustment interval $\Delta q_1$, the adjustment can be performed at the largest number of levels varied at regular intervals. Thus, the liquid coating method of the first embodiment, which is performed on a droplet group basis, allows the ejection amount to be adjusted at a higher resolution than the method performed on a droplet basis.

Second Embodiment

Liquid Ejection Apparatus

A liquid ejection apparatus performing the liquid coating method of the first embodiment will now be described with reference to FIGS. 7 to 12.

FIG. 7 is a schematic perspective view of the liquid ejection apparatus. As shown in FIG. 7, the liquid ejection apparatus 10 includes a work transport mechanism 20 transporting a substrate W or a work in the main scanning direction (Y direction) and a head transport mechanism 30 transporting a head unit 9 in the sub scanning direction (X direction).

The work transport mechanism 20 includes a pair of guide rails 21 and a moving table 22 moving along the guide rails 21, and a stage 5 disposed on the moving table 22 with a rotation mechanism 6 in between and on which the substrate W is placed. The moving table 22 is moved in the main scanning direction by an air slider and a linear motor (not shown) disposed inside the guide rail 21. The stage 5 secures the substrate W by suction and allows the reference axis of the substrate W to be accurately oriented in the main scanning direction or the sub scanning direction with the rotation mechanism 6.

The head transport mechanism 30 includes a pair of guide rails 31 and a moving table 32 moving along the guide rails 31. A carriage 8 is hanged from the moving table 32 with a rotation mechanism 7 in between. The carriage 8 is provided with a head unit 9 including a plurality of ejection heads 50 (see FIGS. 8A and 8B). The ejection head 50 includes a liquid supply mechanism (not shown) supplying a liquid and a head driver 48 (see FIG. 10) electrically controlling the operation of the ejection head 50. The moving table 32 transports the carriage 8 in the X direction to oppose the head unit 9 to the substrate W.

The liquid ejection apparatus 10 further includes a maintenance mechanism at a position opposing the ejection heads 50 for removing clogging in the nozzles of the ejection heads 50 of the head unit 9 and removing foreign matter and contaminant on the nozzle surfaces. Also, a weighing mechanism 60 (see FIG. 10) is provided which includes a balance receiving the liquid ejected from each ejection head 50 and weighing the liquid for each ejection head 50. FIG. 7 omits the maintenance mechanism and the weighing mechanism 60.

Figure 8A:
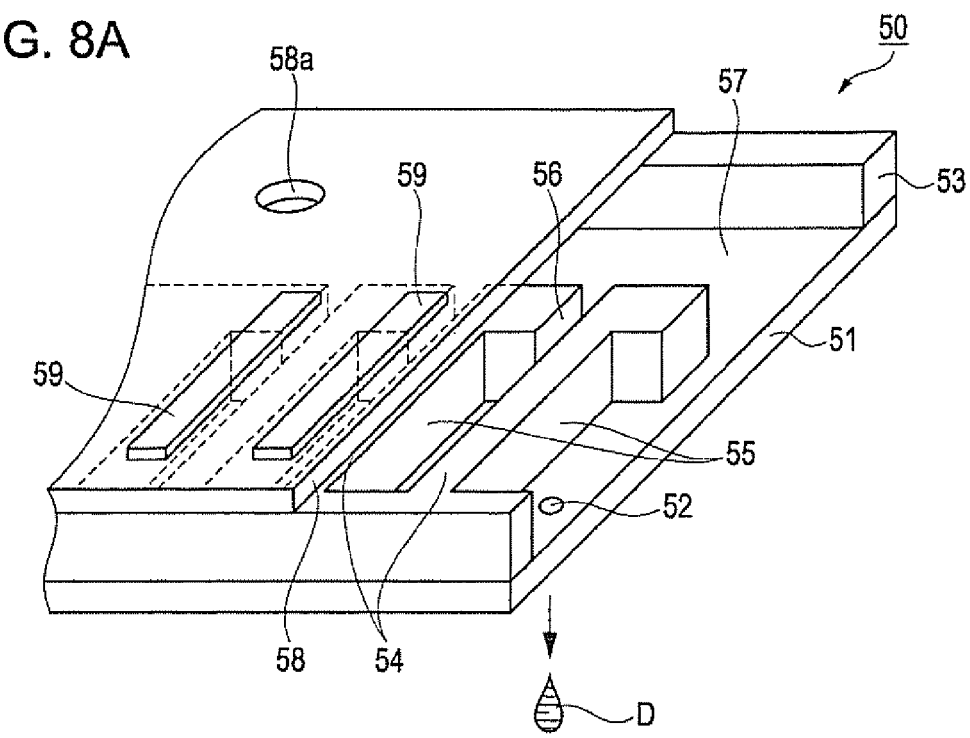
FIG. 8A is a schematic exploded perspective view of an ejection head.
Figure 8B:
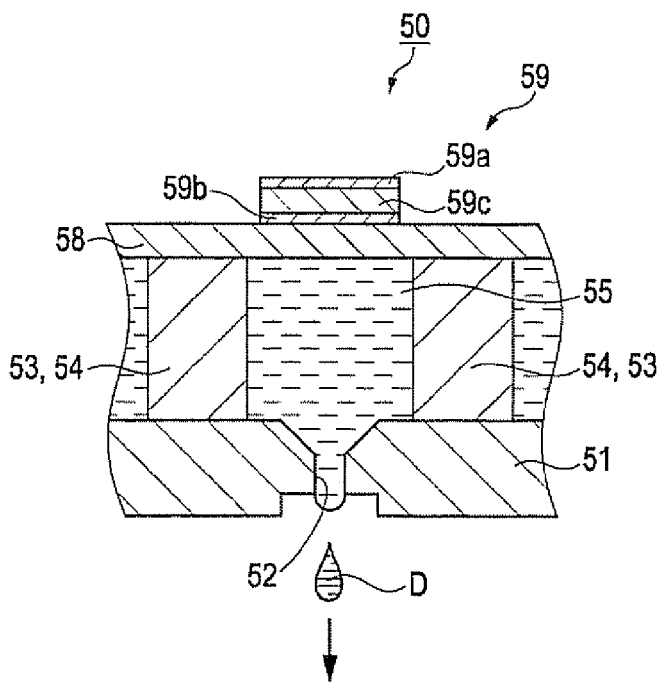
FIG. 8B is a sectional view of the structure of a nozzle portion.

FIGS. 8A and 8B schematically shows the structure of the liquid ejecting head. FIG. 8A is an exploded schematic perspective view, and FIG. 8B is a sectional view of the nozzle. As shown in FIGS. 8A and 8B, the ejection head 50 includes a nozzle plate 51 having a plurality of nozzles 52 through which droplets D are ejected, a cavity plate 53 having partition members 54 that partitions cavities 55 communicating with the respective nozzles 52, and a vibration plate 58 having oscillators 59 corresponding to the respective cavities 55. These plates are stacked and joined in that order.

The cavity plate 53 includes the partition members 54 partitioning the cavities 55 communicating with the nozzles 52 and flow channels 56 and 57 through which the liquid is delivered to the cavities 55. The flow channel 57 is formed between the nozzle plate 51 and the vibration plate 58 and serves as a reservoir in which the liquid is stored.

The liquid is delivered from the liquid supply mechanism through pipes and supplied to the reservoir through a supply port 58a formed in the vibration plate 58, thus filling the cavities 55 through the flow channels 56.

The oscillator 59 is a piezoelectric device including a piezoelectric element 59c and a pair of electrodes 59a and 59b separated by the piezoelectric element 59c, as shown in FIG. 8B. A driving signal is applied to the electrodes 59a and 59b from the outside to deform the vibration plate 58. As the vibration plate 58 is deformed, the volume of the cavity 55 partitioned by the partition members 54 is reduced to compress the liquid. Consequently, the liquid is ejected in droplets D through the nozzle 52. When the driving signal is removed, the vibration plate 58 is restored to recover the volume of the cavity 55. Consequently, the liquid is drawn to the cavity 55 from the reservoir. The ejection amount and ejection speed of each droplet can be varied for ejection control of each nozzle 52 by controlling the driving signal applied to the piezoelectric element 59c.

The ejection head 50 is not necessarily operated by the piezoelectric device. The ejection head 50 may be operated by an electromechanical transducer that displaces the vibration plate 58 by electrostatic adsorption, or by an electrothermal element (thermal element) that heats the liquid to eject droplets D through the nozzle 52.

FIG. 9 is a schematic plan view of the arrangement of the liquid ejecting heads of the head unit when viewed from the side opposing the stage 5 shown in FIG. 7.

As shown in FIG. 9, the head unit 9 includes a head plate 9a on which the ejection heads 50 are arranged. The head plate 9a has, for example, three ejection heads 50. In the present embodiment, the ejection heads 50 (R1, G1, and B1) can eject different liquids.

Each ejection head 50 has two nozzle lines 52A and 52B, each defined by a plurality of (180) nozzles 52 disposed at substantially regular intervals (at a nozzle pitch P1 of about 141 μm). The nozzle lines 52A and 52B are disposed on the nozzle plate 51 such that the nozzles of the two lines are displaced by half (P2) of the nozzle pitch P1 from each other. More specifically, when viewed in the direction perpendicular to the nozzle lines 52A and 52B, the nozzles 52 are practically disposed at a nozzle pitch P2 of 70.5 μm. The nozzle 52 has a diameter of about 28 μm. A single ejection head 50 has a plotting width L that the ejection head 50 can plot, The plotting width L refers to the effective length of the nozzle lines 52A and 52B.

In the present embodiment, the ejection heads 50 (R1, G1, and B1) are disposed in parallel with each other on the head plate 9a.

The ejection heads 50 may be arranged on the head plate 9a without limiting to the above. The number of nozzle lines of the ejection head 50 is not limited to two, and may be one or three or more.

The ejection amount of the droplet D ejected from the nozzles 52 varies among the nozzles 52 because the flow resistance of the liquid varies among the cavities due to the designed dimensions and the processing precision of the cavities 55 and the flow channels 56 and 57. The ejection amount is also affected by where the supply ports 58a are formed in the cavities 55, and, in addition, by the natural oscillation characteristics of the oscillator 59 provided to each cavity 55. Hence, the distribution of the ejection amount of the droplet D ejected through the nozzle may differ among the ejection heads 50.

Figure 10:
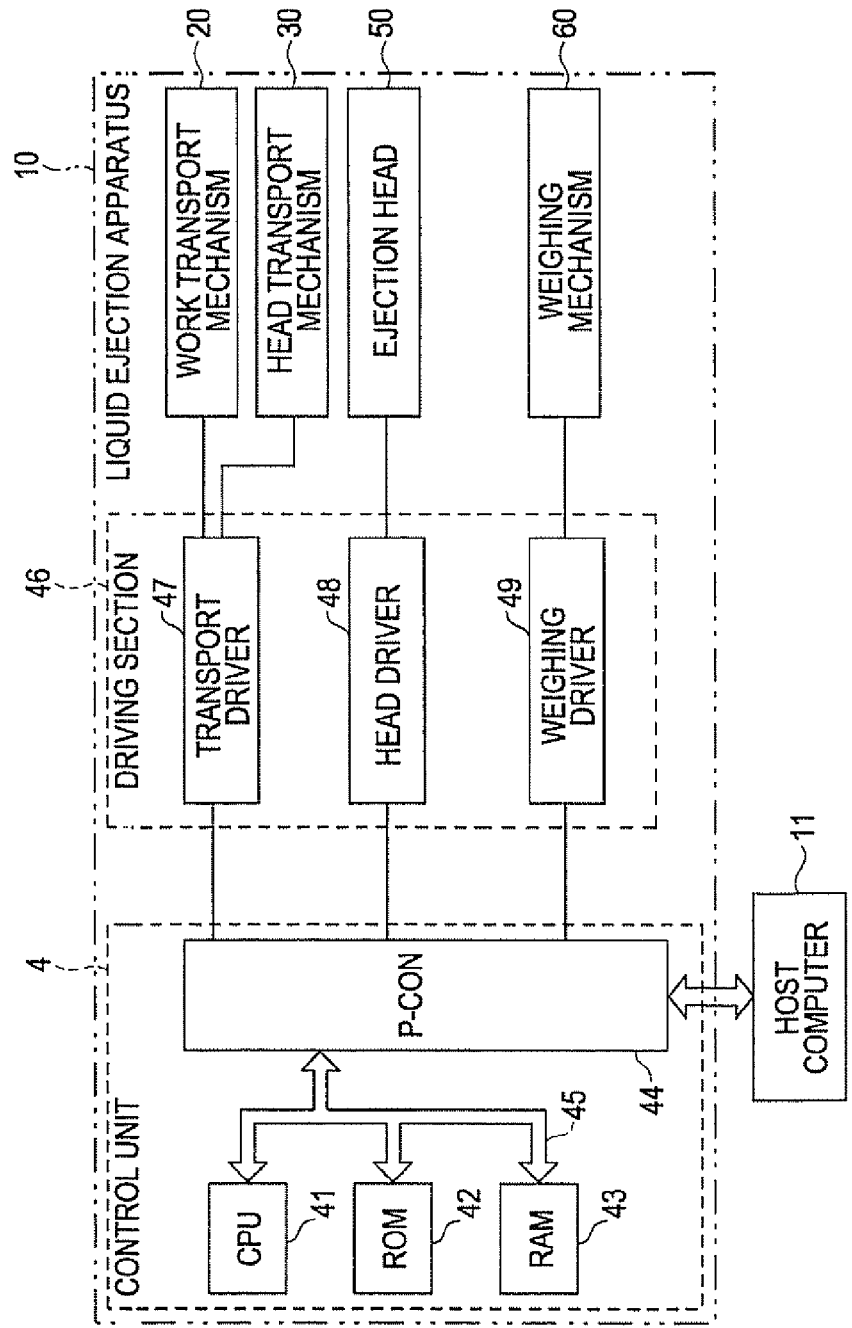
FIG. 10 is a block diagram of the control system of the liquid ejection apparatus.

Now, a driving signal with a predetermined driving voltage is applied to the oscillators 59 to eject several thousand to several tens of thousand droplets D from each nozzle 52, and the weight of the ejected liquid is measured with the weighing mechanism 60 shown in FIG. 10. The measured weight of the liquid is divided by the number of droplets to obtain the weight per droplet. Thus, the ejection amount of the droplet D is estimated in advance. The ejection amount of the droplet D for each nozzle 52 is a type of nozzle information.

The nozzle information may include information of ejection failure of each nozzle 52 due to divergence of droplets (landing position) or clogging in addition to the ejection amount of the droplet D. Hence, the nozzle information represents the ejection performance of the nozzles 52.

The information of the ejection amount of the droplet D may be estimated by measuring the electrical capacity or the normal oscillation characteristics of the driving device without limiting to the above technique. For estimating the nozzle information, the liquid to be actually ejected to the substrate W is not necessarily used, and a test sample may be used, as long as the test sample has substantially the same properties, such as viscosity, fluidity, and vapor pressure.

The control system of the liquid ejection apparatus 10 will now be described. FIG. 10 is a block diagram of the control system of the liquid ejection apparatus 10. The control system includes a driving section 46 including drivers driving the ejection head 50, the work transport mechanism 20, the head transport mechanism 30, and so forth and a control section 4 controlling the liquid ejection apparatus 10 including the driving section 46.

The driving section 46 includes a transport driver 47 that controls the operation of the respective linear motors of the work transport mechanism 20 and the head transport mechanism 30, a head driver 48 that controls the ejection from the ejection head 50, a weighing driver 49 that controls the operation of weighing mechanism 60, and a maintenance driver (not shown) that controls the operation of the maintenance units of the maintenance mechanism.

The control section 4 includes a CPU 41, a RON 42, a RAM 43, and a P-CON (peripheral controller) 44 that are connected to each other through a bus 45. The P-CON 44 is connected to a host computer 11. The ROM 42 includes a control program region storing a control program for processing in the CPU 41 or the like and control data region storing control data or the like used for plotting and recovering functions.

The RAM 43 includes a potting data storage storing plotting data for plotting on the substrate W, a position data storage storing position data of the substrate W and the ejection heads 50 (more specifically, nozzle lines 52A and 52B), and other storages, and is used as a work region in which each control operation is performed. The P-CON 44 is connected to the drivers of the driving section 46 to complements the function of the CPU 41, and in which a logic circuit assembly is disposed to handle interface signals with the peripheral circuits. Thus, the P-CON 44 draws commands from the host computer 11 to the bus 45 as they are or after being processed, and outputs data and control signals transmitted to the bus 45 from the CPU 41 or the like to the driving section 46 as they are or after being processed, in association with the CPU 41.

The CPU 41 inputs detection signals, commands, and data through the P-CON 44 to process data in the RAM 43 according to the control program in the ROM 42, and outputs control signals to the driving section 46 through the P-CON 44, thus controlling the entire liquid ejection apparatus 10. For example, the CPU 41 controls the ejection head 50, the work transport mechanism 20, and the head transport mechanism 30 to oppose the head unit 9 to the substrate W. In synchronization with the relative movement of the head unit 9 and the substrate W, the ejection heads 50 in the head unit 9 eject droplets D of the liquid onto the substrate W through the nozzles 52, thus plotting. In this instance, the ejection of the liquid in synchronization with the movement of the substrate W in the Y direction is referred to as main scanning, and the movement of the head unit 9 in the X direction is referred to as sub scanning. In the liquid ejection apparatus 10, the main scanning and the sub scanning are combined and repeated several times, thereby applying the liquid. The main scanning can be performed by reciprocally moving the substrate W, instead of moving it in one direction with respect to the ejection head 50.

The host computer 11 not only transmits the control program and control information, such as control data, to the liquid ejection apparatus 10, but also corrects the control information. In addition, the host computer 11 functions as an arrangement information-producing section that produces arrangement information for disposing droplets D of the liquid in specific regions on the substrate W according to the above-described nozzle information (ejection performance information) of the nozzle lines 52A and 52B. The arrangement information include positions in the coating regions to which droplets D are ejected (in other words, relative positions between the substrate W and the nozzles 52), number of droplets D to be disposed (in other words, number of ejections for each nozzle 52), on/off information of the nozzles 52 for the main scanning, and ejection timing information. These types of information are expressed, for example, in the bitmap format.

Figure 11:
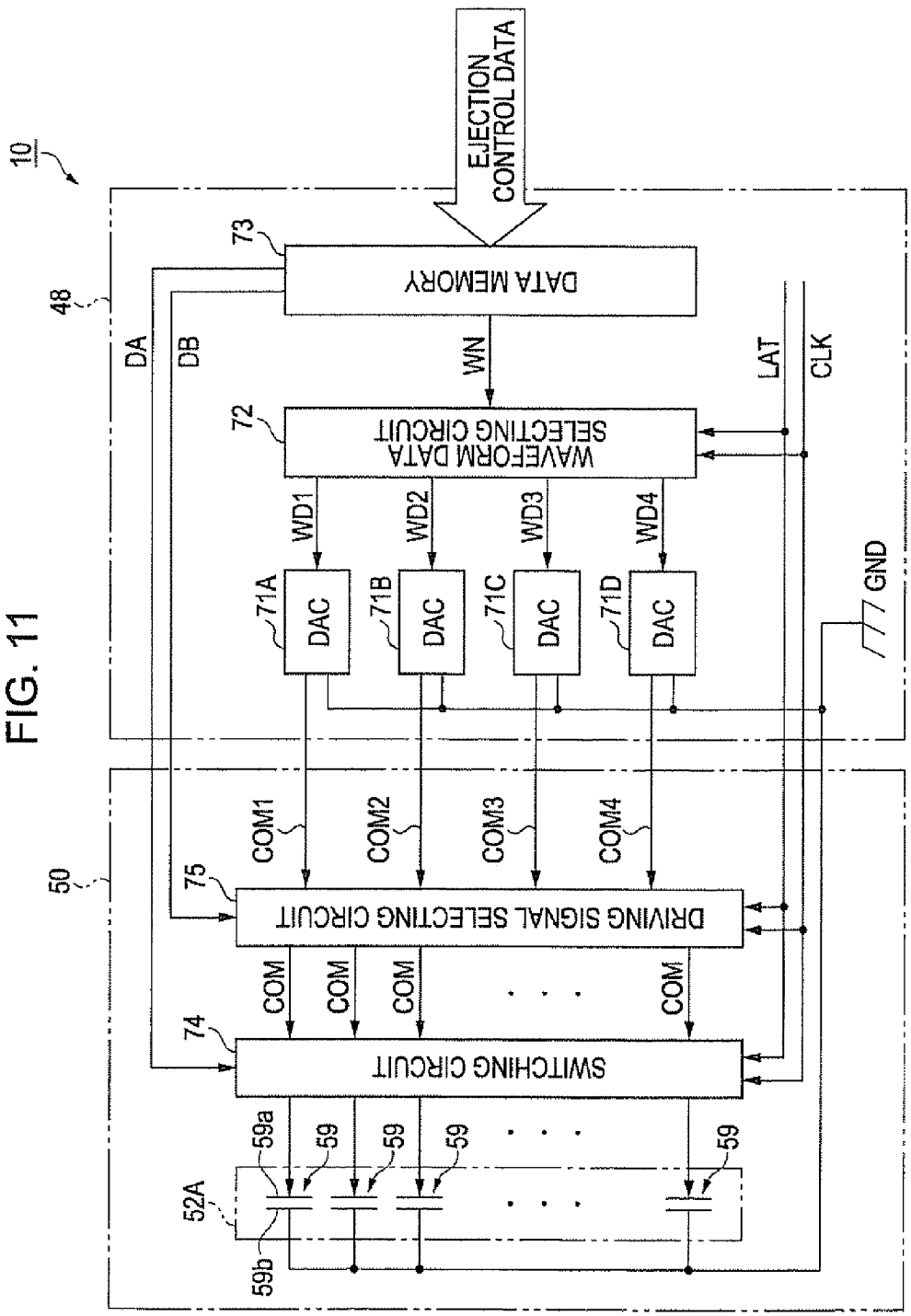
FIG. 11 is a block diagram of an electrical control performed in the ejection head.

Tuning now to FIGS. 11 and 12, a method for controlling the ejection from the ejection head will be described. FIG. 11 is a block diagram showing the electrical control of the ejection head.

As shown in FIG. 11, the head driver 48 includes D/A converters (hereinafter referred to as DAC's) 71A to 71D that independently produce different driving signals (COM's) for controlling the ejection amount of the droplet D; a waveform selecting circuit 72 containing a memory that stores the slew rate data (hereinafter referred to as waveform data (WD1 to WD4)) of the driving signals COM's produced in the DAC's 71A to 71D; and a data memory 73 that stores ejection control data transmitted from the host computer 11 through the P-CON 44. The driving signals COM's produced in the DAC's 71A to 71D are output to the respective COM lines COM 1 to COM 4.

Each ejection head 50 includes a switching circuit 74 that switches on or off the application of a driving signal COM to the oscillator 59 (see FIG. 8) provided for each nozzle 52, and a driving signal selecting circuit 74 selecting any one of the COM lines and transmitting the driving signal COM to the switching circuit 74 connected to the oscillators 59.

In the nozzle line 52A, one electrode 59b of each oscillator 59 is connected to the grounding line (GND) of the DAC's 71A to 71D. The other electrode 59a (hereinafter referred to as segment electrode 59a) of the oscillator 59 is electrically connected to the corresponding COM line through the switching circuit 74 and the driving signal selecting circuit 75. The switching circuit 74, the driving signal selecting circuit 75, and the waveform selecting circuit 72 can receive clock signals (CLK) and latching signals (LAT) corresponding to the ejection timings. The driving circuit of the nozzle line 52B is configured in the same manner.

The data memory 73 stores the following data for each of the ejection timings periodically set according to the scanning positions of the ejection heads 50: ejection data DA determining whether or not a driving signal COM is applied to each oscillator 59 (on/off of the signal application); driving signal selection data DB selecting an appropriate COM line (COM 1 to COM 4) for each oscillator 59, and waveform number data WN identifying the types of waveform data (WD1 to WD4) input to the DAC's 71A to 71D. In the present embodiment, the ejection data DA has one bit (0, 1) for each nozzle; the driving signal selection data DB has two bits (0, 1. 2, 3) for each nozzle; and the waveform number data WN has seven bits (0 to 127) for each DAC. The data configuration can be changed if necessary.

Figure 12:
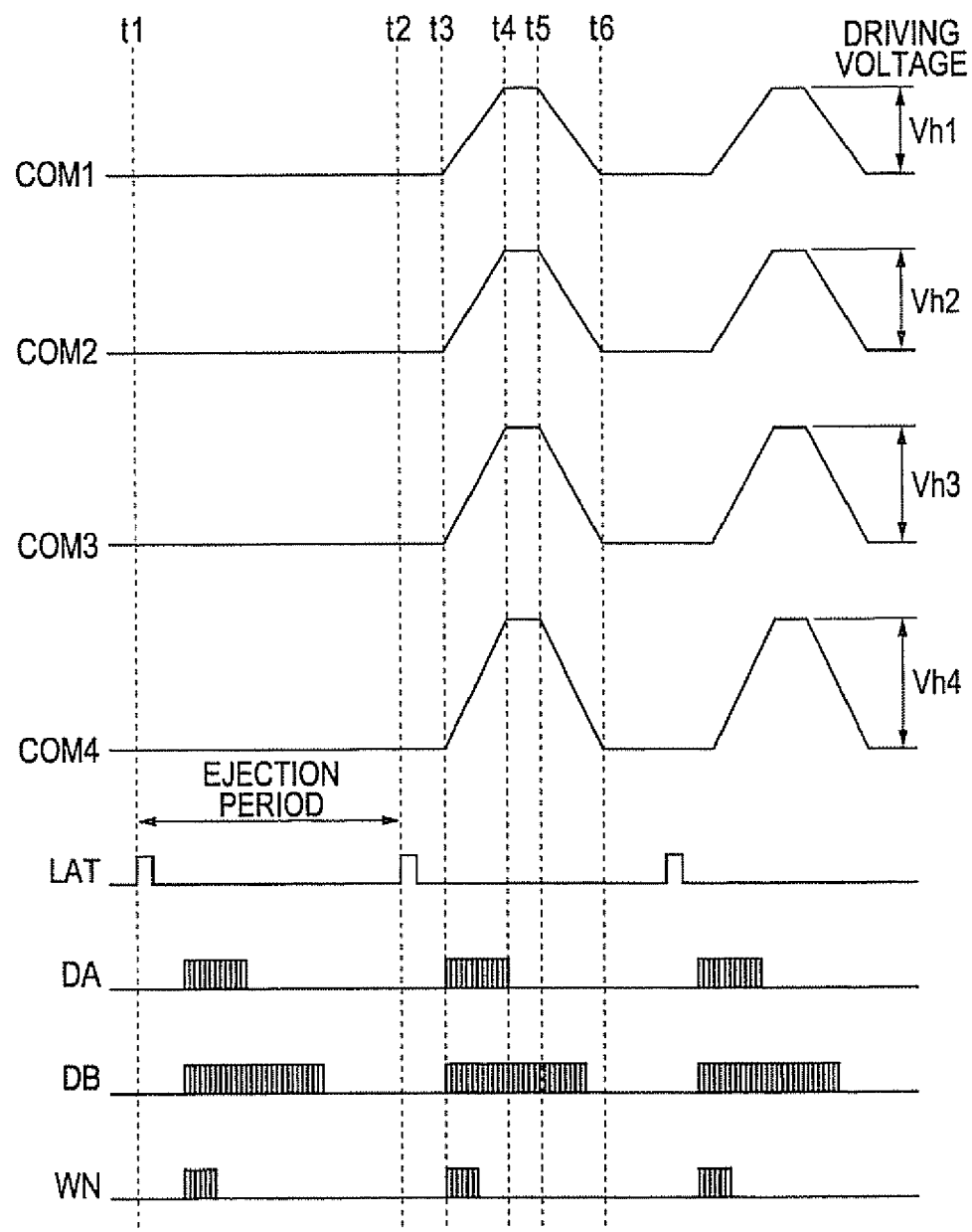
FIG. 12 is a timing chart of driving signals and control signals.

FIG. 12 is a timing chart of driving signals and control signals. The above-described configuration controls the operation involved in the ejection timing as below. As shown in FIG. 12, ejection data DA, driving signal selection data DB, and waveform number date WN are each serialized between the timings t1 and t2, and are transmitted to the switching circuit 74, the driving signal selecting circuit 75, and the waveform data selecting circuit 72. Then, each data is latched at the timing t2. Consequently, the segment electrodes 59a of the oscillators 59 involved in ejection (ON) are connected to a COM line (any one of COM 1 to COM 4) designated by the driving signal selection data DB. When the driving signal selection data DE is "0", for example, the segment electrodes 59a of the oscillators 59 are connected to COM 1. When the driving signal selection data DB is "1", the segment electrodes 59a are connected to COM 2, as well. When the driving signal selection data DB is "2", the segment electrodes 59a are connected to COM 3, When the driving signal selection data DB is "3", the segment electrodes 59a are connected to COM 4. As such selection is made, waveform data (WD1 to WD4) is set which is involved in the production of driving signals in the DAC's 71A to 71D.

Between the timings t3 and t4, a driving signal COM is produced in a series of steps increasing the potential, holding the potential, and reducing the potential according to the waveform data set at the timing t2. The produced driving signal COM is transmitted to the oscillators 59 connected to any one of COM 1 to COM 4, and the volumes (pressures) of the cavities 55 communicating with the nozzles 52 are controlled.

The time component and the voltage component involved in the increase, hold, and decrease in potential of the driving signal COM highly depend on the ejection amount of the liquid ejected by applying the driving signal COM. In particular, a piezoelectric ejection head 50 has a superior linearity between the ejection amount and the voltage component. Accordingly, the variation (difference) in voltage between the timings t3 and t4 is defined as driving voltage Vh (Vh1 to Vh4). The driving voltage Vh can be used as a parameter for controlling the ejection amount. In other words, the driving voltage Vh is one of the parameters of the driving signal for controlling the ejection amount of the droplet D. The driving signal COM is not limited to a simple trapezoidal wave as shown in the present embodiment, and may be appropriately selected from among waves having a variety of waveforms, such as a rectangular wave. In another driving technique (for example, thermal driving), the pulse width (time component) of the driving signal COM may be used as a parameter for controlling the ejection amount.

In the present embodiment, a plurality of types of waveform data having driving voltages Vh varied stepwise are prepared, and the types of waveform data WD 1 to WD 4 are independently input to the DAC's 71A to 71D, respectively. Thus, driving signals COM having different driving voltages Vh1 to Vh4 are output to the COM lines COM 1 to COM 4, respectively. According to the amount of information (7 bits) of the waveform number data WN, 128 types of waveform data can be prepared, and to which driving voltages Vh are assigned in 0.1 V steps. In other words, driving waveforms of Vh1 to Vh4 can be set in 0.1 V steps in a range of voltages having a difference of 12.8 V.

Thus, the liquid ejection apparatus 10 of the present embodiment can eject droplets D of the liquid while the ejection amount is adjusted by appropriately setting the driving signal selection data DB determining how the oscillators 59 (nozzles 52) correspond to the COM lines, and the waveform number data WN determining how the COM lines correspond to the types of driving signals COM (driving voltages Vh), in view of the ejection performance of each nozzle 52. In other words, it is important in ejection control to set appropriate driving signals COM for the nozzles 52 determined by the relationship between the driving signal selection data DB and the waveform number data WN.

In the liquid ejection apparatus 10, the control of the liquid ejection of the ejection head 50 can be performed for each ejection of droplets D. In other words, the driving signal selection data DB and the waveform number data WN can be updated every ejection timing. The driving signal COM can be precisely set corresponding to the ejection data DA. Thus, the ejection amount of the droplet D ejected from each nozzle 52 can be varied every ejection timing in at least four steps. Consequently, the variation in ejection amount of the droplet D depending on the ejection performance of the nozzle lines 52A and 52B can be controlled for each nozzle 52 and for each ejection of droplets D, unlike the case in which a specific driving signal COM is applied to the oscillators 59. Thus, the liquid can be ejected while the unevenness in ejecting the liquid depending on the ejection performance of the nozzle lines 52A and 52B is reduced.

Even though the ejection amount of the droplet D ejected through each nozzle 52 can be varied in at least four steps, the driving signal COM is adjusted for each of many nozzles 52 in order to eject a uniform amount of liquid, for example, a reference ejection amount (or an intended amount). This makes the configuration of the driving circuit complicated.

Accordingly, the present embodiment obtains the variation in ejection amount of the droplet D ejected from the nozzles 52 (from the above-described nozzle information). Then, the coating amount in a plurality of coating regions are obtained from the ejection amount of the droplet D ejected through each nozzle 52 and the arrangement information of the droplets D disposed in the coating region. The range of variations in coating amount is divided into the same number of sections as the number of adjustment levels obtained from the combinations of a plurality of driving signals COM. The coating amounts in a plurality of regions are grouped into a plurality of sections, and the difference between the typical value in each section and a predetermined coating amount is obtained as an adjustment amount. The driving voltages Vh1 to Vh4 of the driving signals COM are set so that coating amounts in which the adjusted amount is reflected can be obtained according to the combination of the driving signals COM. According to the arrangement information of droplets D in the coating regions, the liquid to be ejected is grouped into a plurality of droplet groups having different ejection amounts. Which nozzle 52 is used for each droplet group is determined according to how the nozzles 52 and a substrate W are scanned. A combination of the driving signals in which the adjustment amount is reflected for each coating region is selected and droplets D are ejected. The total amount (coating amount) Q of the plurality of droplet groups can be controlled by varying the ejection amount of the droplet among the droplet groups to be applied to the coating region according to the combination of adjustment levels assigned to the respective droplet groups using a limited number of driving signals COM. Thus, the variation in the total amount (coating amount) Q of the liquid can be in a narrower range than the variation in ejection amount of the droplet D ejected from the nozzles 52.

More specifically, the CPU 41 calculates the adjustment amount for each section according to the nozzle information. Alternatively, the host computer 11 may calculate the adjustment amount and the CPU 41 receives the calculation result as data. A plurality of driving signals COM having different driving voltages Vh are produced from the data of adjustment amount so that a plurality of adjustment levels can be obtained. Ejection data DA is produced for each droplet group by linking the driving signal selection data DB to the waveform number data WN using the arrangement information of droplets D in the coating region. The control section 4 controls other sections of the liquid ejection apparatus 10 according to the arrangement information and the ejection data DA and operates so as to eject droplets D.

The nozzle information is obtained for each of the nozzle lines 52A and 52B including, for example, 180 nozzles 52 and for each ejection head 50. For obtaining the nozzle information, it is preferable that the driving voltage Vh of the reference driving signal is adjusted for each nozzle line in advance so that the average ejection amount of the droplet D when a reference driving signal is applied becomes the reference ejection amount (intended ejection amount) of the droplet D. Thus, the variations between the nozzle lines and among ejection heads can be adjusted in advance.

A liquid coating method using the liquid ejection apparatus 10 will now be described with reference to FIGS. 13 to 16.

Figure 13:
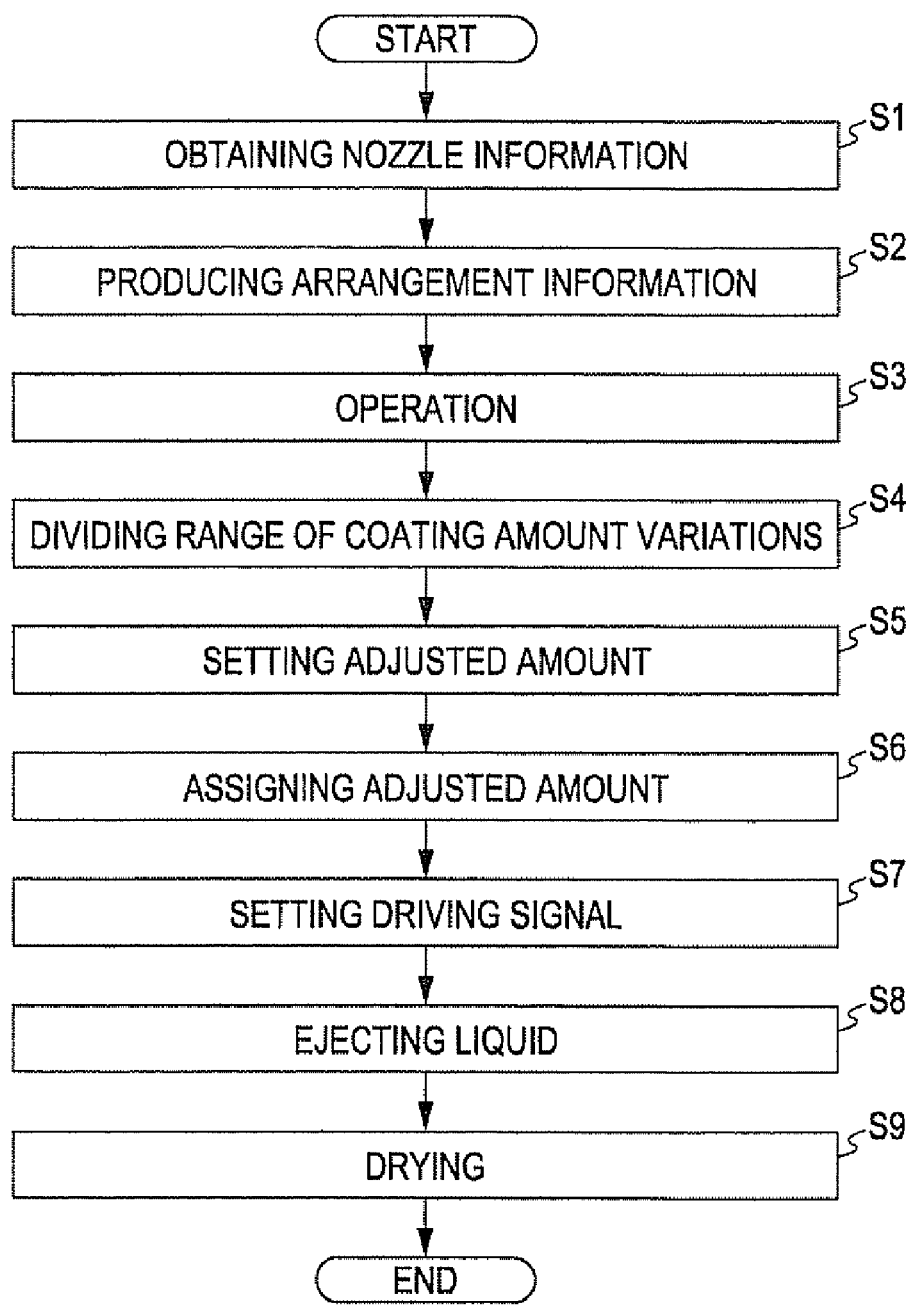
FIG. 13 is a flow chart of a liquid coating method.

FIG. 13 is a flow chart of the liquid coating method. As shown in FIG. 13, the liquid coating method of the present embodiment forms thin films in coating regions on a substrate W by ejecting droplets D from at least one of a plurality of nozzles 52 of an ejection head 50 while the substrate W and the ejection head 50 opposing each other are scanned for relative movement.

The liquid coating method of the present embodiment includes: obtaining nozzle information (step S1); and producing arrangement information for disposing droplets D linked to a plurality of droplet groups to the coating region (step S2). In addition, the method includes: calculating the coating amount of the liquid to be applied for each coating region (step S3) and dividing the variation in coating amount into a plurality of sections (step S4). The method further includes calculating the difference between the typical value and a predetermined coating amount in each section to set adjustment amounts adjusted from the predetermined coating amount for the respective sections (step S5); and assigning the adjustment amount to the droplet groups so that the assigned adjustment amounts vary from one droplet group to another (step S6). In order to obtain coating amounts that have taken the assigned adjustment amounts into account using combinations a plurality of driving signals, the driving signals are set for each droplet group (step S7). Also, a selected nozzle 52 is driven with driving signals selected from the combinations, thereby ejecting the liquid to each coating region through the nozzle (step S8), and the regions coated with the liquid are dried to form thin films (step S9).

Step S1 in FIG. 13 obtains nozzle information. In step S1, a reference driving signal COM is selected from a plurality of driving signals COM's, and the reference driving signal is applied to the oscillator 59 over several thousand to several tens of thousand times to eject the liquid. The ejected liquid is weighed and the result is divided by the number of ejections to obtain an amount (weight) of droplet D per ejection for each nozzle 52. Such nozzle information is obtained for each ejection head 50 and for each of the nozzle lines 52A and 52B, as described above. For obtaining the nozzle information, it is preferable that the driving voltage Vh of the reference waveform be adjusted in advance. Then, step S2 is performed.

Step S2 in FIG. 13 produces arrangement information. In the arrangement information, the liquid to be applied to the coating region is linked to a plurality of droplet groups, each including at least one droplet D. For the sake of easy understanding of the following steps, the present embodiment is described on the assumption that the reference ejection amount of the droplet D is 10 ng and that three droplets D (30 ng) is applied to a single coating region. The disposal of the droplets D in the coating region is linked to how the nozzles 52 (ejection head 50) and the substrate W are scanned, and thus which nozzle 52 is used is determined. How the droplets D are disposed in the coating region is appropriately determined in view of the area of the coating region, the coating amount of the liquid, and the ejection amount per droplet. Then, step S3 is performed. The number of nozzles 52 used for applying droplet groups to one coating region is not necessarily one. The droplet group may be defined by droplets ejected from a plurality of nozzles 52 depending on the behavior of scanning. The nozzles 52 or the ejection head 50 may be changed according to the manner of scanning.

Step S3 in FIG. 13 performs operation. In step S3, the coating amount of the liquid applied to each region on the substrate W is calculated according to the nozzle information obtained in Step S1 and the arrangement information determined in step S2. When the arrangement information and nozzles 52 to be used are determined, the ejection amount of each nozzle 52 driven with the reference driving signal can be obtained from the nozzle information. By multiplying the ejection amount and the number of ejections, which is part of the arrangement information, the coating amount is obtained.

The obtained coating amount includes the variation in ejection amount of the plurality of nozzles 52. Then, step 54 is performed.

Figure 14:
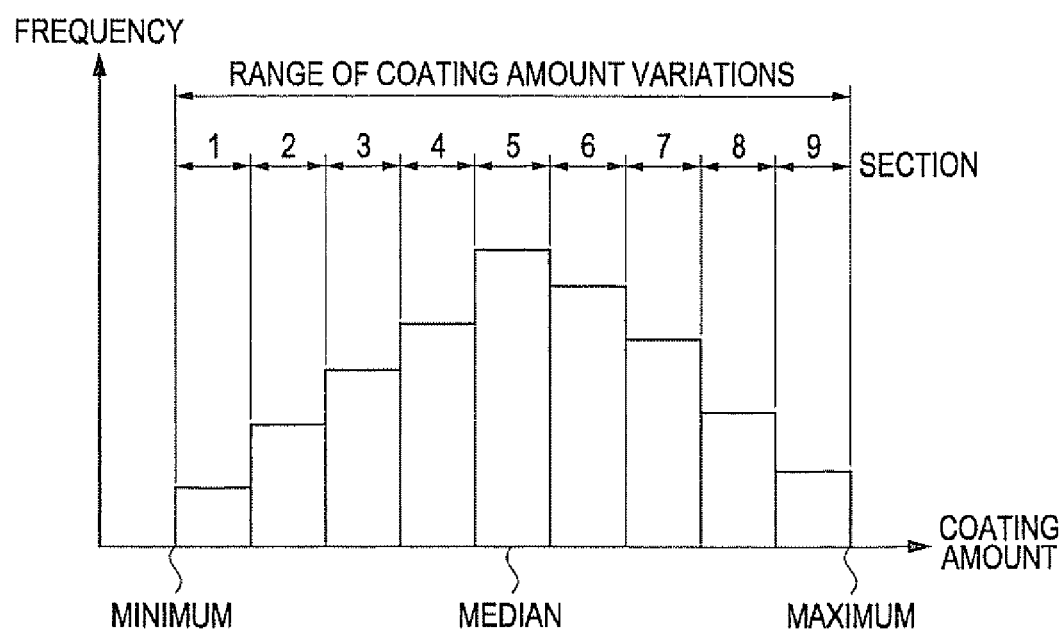
FIG. 14 is a graph showing a frequency distribution of variations in ejection amount.

Step S4 in FIG. 13 divides the variation in coating amount into a plurality of sections. FIG. 14 is a graph showing the frequency distribution of the coating amounts. In Step S4, the variation in coating amount defined by the range between the maximum coating amount and the minimum coating amount is divided into 9 sections, as shown in FIG. 14. Assume that the variation in droplet ejection amount is a reference ejection amount ±10%. When, for example, the reference ejection amount is 10 ng and three droplets D are applied, the coating amount is in the range of 27 to 33 ng. Hence the range of variations in coating amount is 6 ng, and the range of variations per section is 6/9=0.67 ng (about 0.7 ng). Then, step S5 is performed.

Step S5 in FIG. 13 sets adjustment amounts. In Step S5, the difference between the typical coating amount in each section of the variation and a predetermined coating amount is calculated, and the difference is defined as the adjustment amount for the corresponding section. FIG. 15 is a table showing the range of coating amounts and the adjustment amount in each section. Since the range of each section is 0.7 ng, section 1 is in the range of 27 to 27.7 ng, including the minimum coating amount (27 ng), as shown in FIG. 15. Section 9 including the maximum coating amount (33 ng) is in the range of 32.3 to 33.0 ng. Section 5 including the median coating amount (30 ng) is selected as the target of the adjustment according to the method shown in Table 5 (FIG. 5) according to the first embodiment. More specifically, letting a predetermined coating amount be 30 ng, the adjustment amount for each section is as shown in FIG. 15. For example, the typical coating amount in section 1 exhibiting the smallest coating amount is 27.3 ng, and the adjustment amount becomes +2.7 ng in section 1. The adjustment amount in section 5 including the median is of course 0 ng. The typical coating amount in section 9 exhibiting the largest coating amount is 32.7 ng, and the adjustment amount becomes −2.7 ng. The adjustment amounts in other sections are obtained in the same manner. The values shown in FIG. 15 are rounded off to the first decimal places.

The median Qz of coating amounts Q can be obtained from the following equation (2) for each section:

$$Q_z = \left(z - \frac{1}{2}\right)\left(\frac{Q_{max} - Q_{min}}{N_z}\right) + Q_{min} \qquad (2)$$

where z represents a section number of 1 to 9, $Q_{max}$ represents the maximum coating amount, $Q_{min}$ represents the minimum coating amount, and $N_z$ represents the total number of sections and is equal to the number of adjustment levels.

The minimum unit ΔQ of the adjustment amount is obtained from equation (3):

$$\Delta Q = \frac{Q_{max} - Q_{min}}{N_z} \qquad (3)$$

In the present embodiment, ΔQ=0.67 ng. Then, step S6 is performed.

Step S6 in FIG. 13 assigns the adjustment amounts. In Step S6, the adjustment amount for each section (adjustment intervals) is assigned to the droplet groups so as to differ from one droplet group to another. FIG. 16 is a table showing the respective adjustment amounts of the droplet groups corresponding to the sections. When three droplets D are applied to each coating region, as described above, the three droplets are grouped into a first droplet group $Gr_1$ including two droplets D and a second droplet group $Gr_2$ including one droplet D, and the adjustment amount is assigned as shown in FIG. 16. More specifically, the adjustment amount of the first droplet group $Gr_1$ is 0±2.0 ng, and the adjustment amount of the second droplet group $Gr_2$ is 0±0.7 ng. Hence, the first droplet group $Gr_1$ is adjusted by ±1 ng per droplet, and the second droplet group $Gr_2$ is adjusted by ±0.7 ng per droplet. The values shown in FIG. 16 are rounded off to the first decimal places, as well.

Thus, a larger adjustment amount (adjustment interval) is assigned to the first droplet group $Gr_1$ including the larger number of droplets, and a smaller adjustment amount (adjustment interval) is assigned to the second droplet group $Gr_2$. Consequently, the rate of adjustment per droplet can be leveled. The larger adjustment amount (rounded off to 2.0 ng in absolute value, but is 2.01 ng being three times of 0.67) is three times of the smaller adjustment amount (rounded off to 0.7 ng in absolute value, but precisely 0.67). Thus, highly precise adjustment can be performed with a small error. Then, Step S7 is performed.

Step S7 in FIG. 13 sets driving signals. In Step S7, waveforms of driving signals COM are set according to the assignment in Step S6. For example, the driving waveform of the COM 3 line shown in FIG. 12 is selected as the reference driving signal. Then, the driving voltage Vh4 of the driving waveform of the COM 4 line can positively adjust the ejection amount and is set corresponding to the respective adjustment levels of the droplet groups $Gr_1$ and $Gr_2$.

The driving voltage Vh2 of the driving waveform of the COM 2 line, which can negatively adjust the ejection amount, is set corresponding to the respective adjustment levels of the droplet groups $Gr_1$ and $Gr_2$, as well. More specifically, ejection data DA is produced for each of the droplet groups $Gr_1$ and $Gr_2$ by linking driving signal selection data DB and waveform number data WN, as described above. The driving waveform of the other COM line COM 1 is set so as to have a driving voltage Vh1 at which droplets D cannot be ejected. By applying the driving waveform of the COM 1 line to unselected (unused) nozzles 52, the meniscus of the liquid in those nozzles 52 is vibrated to prevent the liquid from drying to clog the nozzles. Then, step S8 is performed.

Step S8 in FIG. 13 ejects the liquid. In Step S8, the ejection head 50 ejects droplets D to the coating regions through the selected nozzle 52 while the ejection head 50 and the substrate W are scanned, according to the produced arrangement information and ejection data DA. In this instance, three droplets D of the first and second droplet groups $Gr_1$ and $Gr_2$ are ejected to the coating region. The ejection amounts of the droplet groups $Gr_1$ and $Gr_2$ are adjusted, and the coating amount Q of the liquid, which is the total amount of the droplets of the droplet groups $Gr_1$ and $Gr_2$, lies in an ideal range (the range of section 5) including the product of the reference ejection amount (10 ng) and the total number of droplets (n=3), that is, the predetermined coating amount, as the median. In practice, the coating amount Q can be affected by environmental changes, such as liquid temperature (affecting the viscosity of the liquid), and changes in electrical load of the ejection head 50. Accordingly, the coating amount Q does not necessarily lie in the predetermined range (range of coating amounts in section 5), but in a narrower range of variation than the range of variation in ejection amount, Then, step S9 is performed.

Step S9 in FIG. 13 dries the liquid. In Step S9, the substrate W is heated to dry the liquid applied to the coating regions.

Thus, the solvent is removed from the liquid to form a thin film of the solute. The substrate W may be heated in drying oven heated with a heat source, such as an IR lamp or a heater. Alternatively, the liquid may be dried under reduced pressure at a controlled evaporation rate, depending on the properties of the solvent.

The second embodiment produces the following effects:

(1) In the liquid coating method of the second embodiment, variations in droplet amount ejected from a plurality of nozzles 52 are obtained as nozzle information. The coating amount of the liquid for each coating region is obtained from the nozzle information and the arrangement information of droplets D in a plurality of coating regions. The variation in coating amount is divided into nine sections at regular intervals, and the adjustment amount adjusted from a predetermined coating amount is obtained for each section. Then, the adjustment amount is varied between the droplet groups $Gr_1$ and $Gr_2$ applied to the coating region. For ejection, droplets D including the droplets in the groups $Gr_1$ and $Gr_2$ are ejected according to the arrangement information of the droplet groups $Gr_1$ and $Gr_2$ and ejection data DA. The ejection data DA includes information of nozzles 52 to be used and driving signal COM selection data that can adjust the ejection amount of the nozzles 52. Thus, the liquid applied to the coating region is constituted of the droplet groups $Gr_1$ and $Gr_2$ in which the adjustment amounts (adjustment intervals) are varied between the groups. Thus, the coating amount Q can lie in a smaller range than the range of variations in ejection amount of a droplet D. Ideally, the coating amount Q lies in a predetermined range (range of coating amounts Q in section 5) including the product of a reference ejection amount (10 ng) and the total number of droplets (n=3) as the median.

(2) In the liquid coating method of the second embodiment, a larger adjustment amount is assigned to the droplet group $Gr_1$ including the larger number of droplets, and a smaller adjustment amount is assigned to the droplet group $Gr_2$ including a smaller number of droplets. Consequently, the rate of adjustment for each of the droplet groups $Gr_1$ and $Gr_2$ is leveled on a droplet basis. Thus, highly precise adjustment can be performed with a small error.

The number of droplet groups applied to the coating regions, the number of droplets constituting the droplet group, and the ejection amount of the droplet group may be the same or different without limitation. For example, the numbers of droplets D constituting the droplet groups $Gr_1$ and $Gr_2$ may be the same. In this instance, the adjustment amount is divided into a larger adjustment amount and a smaller adjustment amount for each section so that the amounts of droplet of the respective droplet groups $Gr_1$ and $Gr_2$ can be different from each other, and the two adjustment amounts are assigned to the droplet groups $Gr_1$ and $Gr_2$. In order to level the percentages of adjustment performed with droplet groups $Gr_1$ and $Gr_2$, or in order to perform highly precisely adjustment, the larger adjustment amount (wider adjustment interval) is preferably set to an integral multiple of 2 or more of the smaller adjustment amount (narrower adjustment interval).

Third Embodiment

A method for manufacturing an organic EL (electroluminescent) element to which the liquid coating method of the second embodiment is applied will now be described with reference to FIGS. 17 to 21A and 21B.
Organic EL Device An organic EL device will first be described. FIG. 17 is a schematic sectional view of an organic EL device. As shown in FIG. 17, the organic EL device 600 of the present embodiment includes an element substrate 601 having a light-emitting element portion 603 acting as an organic EL element, and a sealing substrate 620 bonded for sealing to the element substrate 601 with a space 622 in between. The element substrate 601 includes a circuit element portion 602. The light-emitting element portion 603 is disposed on the circuit element portion 602 and is driven by the circuit element portion 602. The light-emitting element portion 603 includes three-color luminescent layers 617R, 617G, and 617B acting as organic EL luminescent layers formed in a striped manner in the respective luminescent layer-forming regions A. The element substrate 601 includes picture elements, each constituted of three luminescent layer-forming regions A corresponding to the three color luminescent layers 617R, 617G, and 617B. The picture elements are arranged in a matrix manner on the circuit element portion 602 of the element substrate 601. The organic EL device 600 emits light from the light-emitting element portion 603 across the element substrate 601.

The sealing substrate 620 is made of glass or a metal and is bonded to the element substrate 601 with a sealing resin. The sealed inner surface is coated with a getter 621. The getter 621 absorbs water or oxygen permeating into the space 622 between the element substrate 601 and the sealing substrate 620 to prevent the degradation of the light-emitting element portion 603 resulting from the permeation of the water or oxygen. The getter 621 may not be used.

The element substrate 601 has a plurality of luminescent layer-forming regions A on the circuit element portion 602, and includes a bank 618 separating the luminescent layer-forming regions A from each other, electrodes 613 formed in the respective luminescent layer-forming regions A, and hole injection/transport layers 617a formed on the respective electrodes 613. In the light-emitting element portion 603, three types of liquid, each containing a luminescent layer material are applied to the luminescent layer-forming regions A, which act as coating regions, to form luminescent layers 617R, 617G, and 617B. The bank 618 is made of an insulating material and surrounds each electrode 613 so as not to develop a short-circuit between the luminescent layers 617R, 617G, and 617B formed on the respective hole injection/transport layers 617a and the electrodes 613.

The element substrate 601 is made of a transparent material, such as glass, and a base protective film 606 is formed of silicon oxide on the element substrate 601. Semiconductor films 607 are formed of polycrystalline silicon in a island manner on the base protective film 606. The semiconductor films 607 each have a set of a source region 607a and a drain region 607b formed by implantation of a high concentration of phosphorus ions. The region not doped with phosphorus ions is a channel region 607c. In addition, a transparent gate insulating film 608 is formed to cover the base protective film 606 and the semiconductor films 607. Gate electrodes 609 are formed of Al, Mo, Ta, Ti, W, or the like on the gate insulating film 608, and a first insulating interlayer 611a and a second insulating interlayer 611b are formed on the gate electrodes 609 and the gate insulating film 608. The gate electrodes 609 oppose the respective channel regions 607c of the semiconductor films 607. Contact holes 612a and 612b pass through the first insulating interlayer 611a and the second insulating interlayer 611b to be connected to the source region 607a and the drain region 607b of the semiconductor film 607, respectively. Transparent electrodes 613 of, for example, ITO (indium tin oxide) are patterned on the second insulating interlayer 611b, and are each connected to one contact hole 612a of the pair of contact holes. The other contact hole 612b is connected to a power line 614. The circuit element portion 602 thus includes driving thin film transistors 615 connected to the respective electrodes 613. The circuit element portion 602 includes other thin film transistors for hold capacitors and switching, which are not shown in FIG. 17.

The light-emitting element portion 603 includes the electrodes (anodes) 613, the hole injection/transport layers 617a formed on the respective electrodes 613, the luminescent layers 617R, 617G, 617B (generally referred to as luminescent layers Lu), and a cathode 604 covering the bank 618 and the luminescent layers Lu. The hole injection/transport layer 617a and the luminescent layer Lu define a function layer 617 excites emitted light. If the cathode 604, the sealing substrate 620, and the getter 621 are formed of transparent materials, light can be emitted through the sealing substrate 620.

The organic EL device 600 includes scanning lines (not shown) connected to the gate electrodes 609 and signal lines (not shown) connected to the source regions 607a. When the switching thin film transistor (not shown) is turned on by a scanning signal transmitted to the scanning line, the potential of the signal line at that time is held in the hold capacitor, and the on/off state of the driving thin film transistor 615 is determined according to the state of the hold capacitor. A current flows to the electrode 613 from the source line 614 through the channel region 607c of the driving thin film transistor 615 and further flows to the cathode 604 through the hole injection/transport layer 617a and the luminescent layer Lu. The luminescent layer Lu emits light according to the current. Such light emitting mechanism of the light-emitting element portion 603 allows the organic EL device 600 to display desired letters or images.

Figure 18A:
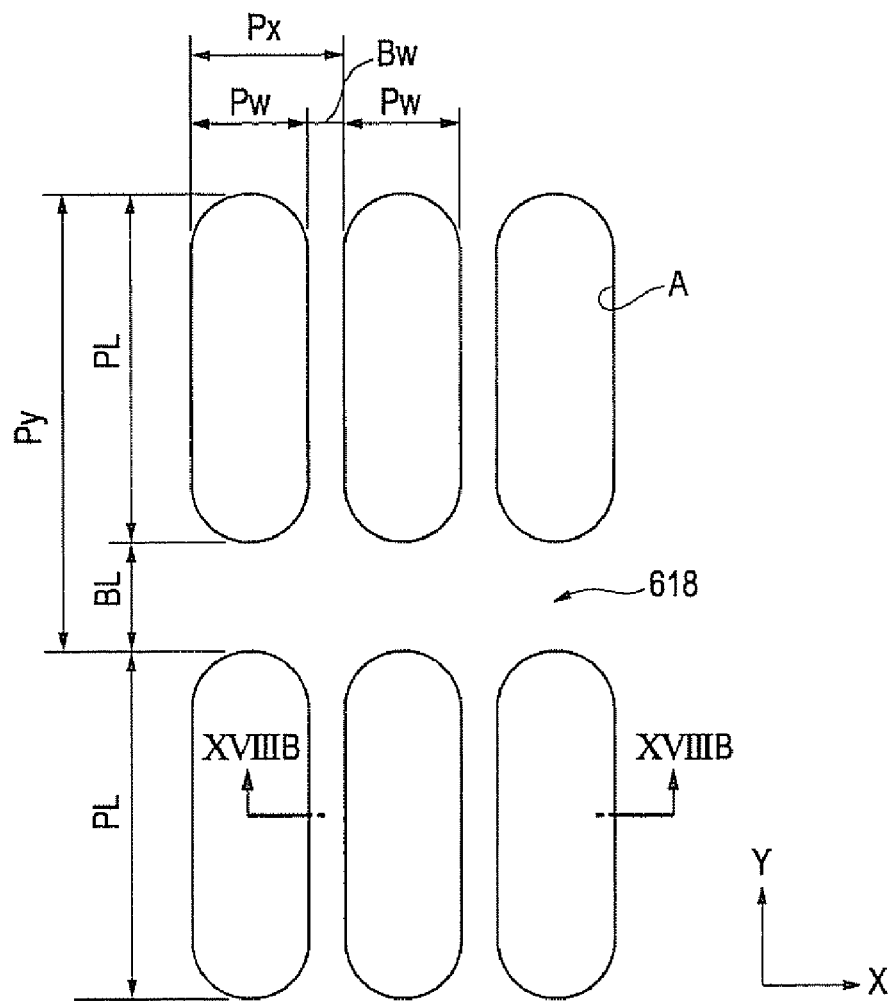
FIG. 18A is a schematic plan view of luminescent layer-forming regions on a substrate.
Figure 18B:
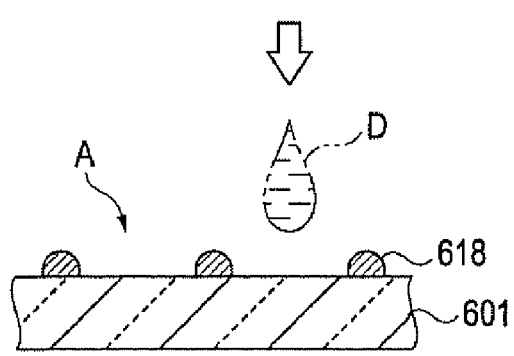
FIG. 18B is a schematic sectional view taken along line XVIIIB-XVIIIB in FIG. 18A.

FIGS. 18A and 18B are schematic representations of an arrangement of the luminescent layer-forming regions A on the substrate: FIG. 18A is a schematic plan view; and FIG. 18B is a schematic sectional view taken along line XVIIIB-XVIIIB in FIG. 18A. As shown in these figures, a plurality of luminescent layer-forming regions A are arranged in the X and Y directions in a matrix manner on a work, or the element substrate 601. The luminescent layer-forming regions A are each surrounded by the bank 618 on the element substrate 601 and in a track form that is long in the Y direction. The ends in the Y direction of the luminescent layer-forming region A are formed into arcs in view of the spread of landing droplets D.

The bank 618 is desirably water-repellent at least at the surface (droplet landing surface). Even if droplets D land on part of the bank 618, the water-repellent surface allows the droplets D to be collected in the luminescent layer-forming region A. The bank 618 can be formed by, for example, applying a water-repellent photosensitive resin material to the surface of the substrate W, followed by exposure and development by photolithography. If a non-water-repellent photosensitive resin material is used, the surface of the bank 618 may be surface-treated for water repellency with a fluorine-based gas.

While how the luminescent layer-forming regions A are arranged on the element substrate 601 is the matter of design, highly fine and precise arrangement is required. For an arrangement with a density of 200 ppi (pixel per inch), for example, luminescent layer-forming regions A each having a width $P_W$ of 32 µm are disposed at a pitch $P_X$ of 42 µm in the x direction, and hence the bank 618 has widths $B_W$ of 10 µm each in the X direction. The luminescent layer-forming regions A have lengths $P_L$ of 96 µm in the Y direction and are disposed at a pitch Py of 126 µm in the Y direction, and hence the bank 618 has widths $B_L$ of 30 µm in the Y direction. Consequently, the luminescent layer-forming regions A have an aperture ratio of about 18%. If the aperture ratio is increased, the widths $B_W$ and $B_L$ of the bank must be reduced.

The height of the bank 618 is set according to the total amount of the liquid applied to the luminescent layer-forming region A. In the present embodiment, the bank 618 has a height of about 2 to 3 µm.

Such a highly fine and precise arrangement of the luminescent layer-forming regions A is liable to cause the problem that droplets D deviate beyond the bank 618 to land on the adjacent luminescent layer-forming region A even if the deviation is small. In other word, a desired amount of liquid may not be applied to desired luminescent layer-forming regions A. Accordingly, a requirement for liquid ejection is that droplets D are landed on substantially the center of the luminescent layer-forming region A, as shown in FIG. 18B.

Even if the droplets D are landed on substantially the center of the luminescent layer-forming region A, but if the ejection amount of droplet D is varied, it is difficult to stably apply a desired amount of liquid to the luminescent layer-forming region A. Since the luminescent layers Lu are formed by the liquid coating method of the second embodiment in the present embodiment, a desired amount of liquid can be applied to each luminescent layer-forming region A with small variations. Consequently, the resulting organic EL device can exhibit high display quality with reduced problems, such as unevenness in emission or brightness, and can display highly fine and precise images.

Method for Manufacturing Organic EL Element

Figure 19:
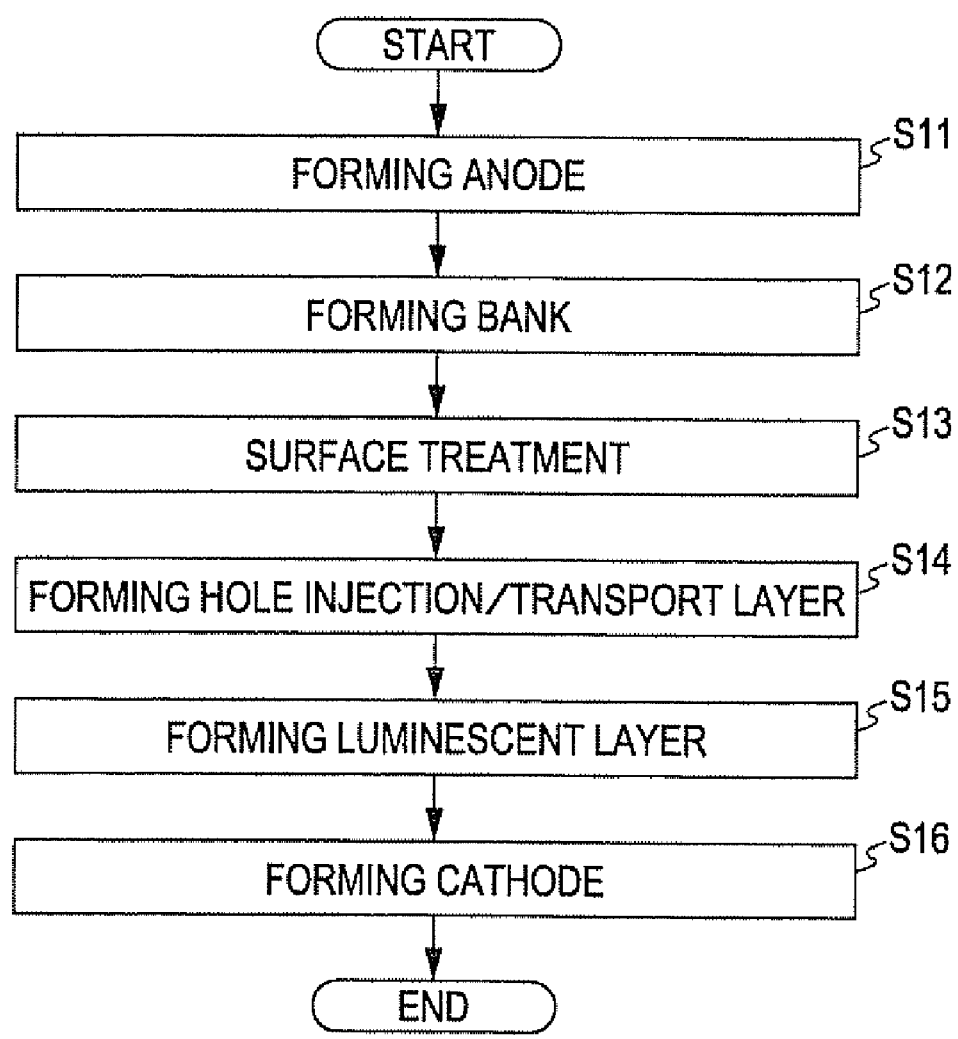
FIG. 19 is a flow chart of a method for preparing a light-emitting element portion.
Figure 21A:
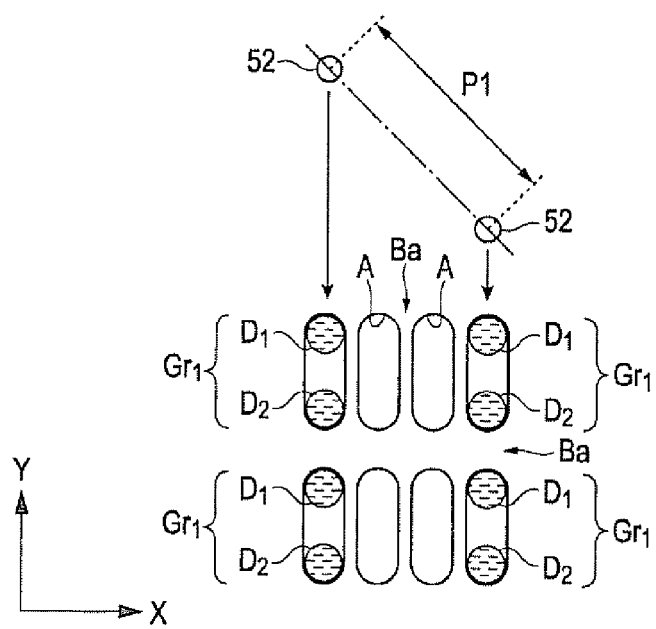
FIGS. 21A and 21B are schematic plan views of a liquid coating method.
Figure 21B:
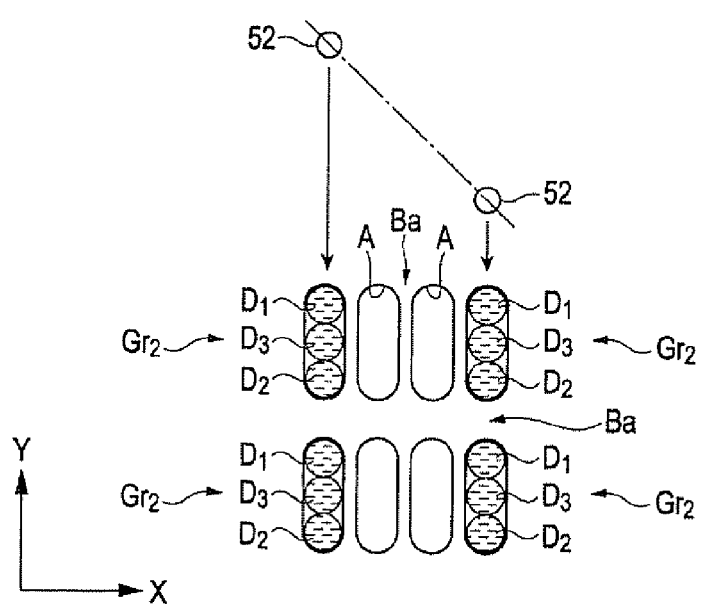

A method for manufacturing the light-emitting element portion 603 (organic EL elements) of the present embodiment will now be described with reference to FIGS. 19 to 21A and 21B. FIG. 19 is a flow chart of the method for manufacturing the light-emitting element portion. FIGS. 20A to 20F are sectional views showing the method for manufacturing the light-emitting element portion. FIGS. 21A and 21B are schematic plan vies of a method for ejecting a liquid. FIGS. 20A to 20F omit the circuit element portion 602 formed on the element substrate 601.

As shown in FIG. 19, the light-emitting element portion 603 manufacturing method of the present embodiment includes an anode forming step (Step S11) that forms electrodes 613 in a plurality of regions intended for luminescent layer-forming regions A on an element substrate 601 and a bank forming step (Step S12) that forms a bank 618 so as to overlap part of the electrode 613. The method further includes a surface treatment step (Step S13) that treats the surfaces of the luminescent layer-forming regions separated by the bank 618, an ejection step that ejects a liquid containing a hole injection/transport layer material to the surface-treated luminescent layer-forming regions A, and a luminescent layer forming step (Step S14) that dries the ejected liquid to form hole injection/transport layers 617a. The method further includes an ejection step that ejects three types of liquid each containing a different luminescent layer material to the luminescent layer-forming regions A, and a luminescent layer forming step (Step S15) that dried the three types of liquid to form luminescent layers Lu. Furthermore, a cathode forming step (Step S16) is performed to form a cathode 604 so as to cover the bank 618 and the luminescent layers Lu. The luminescent layer-forming regions A are coated with the liquids by the liquid coating method of the second embodiment. Accordingly, the arrangement of the ejection heads 50, as shown in FIG. 9, is applied in a head unit 9.

Step S11 in FIG. 19 forms electrodes (another) 613. As shown in FIG. 20A, in Step S11, electrodes 613 are formed in regions intended for luminescent layer-forming regions A on an element substrate 601. Specifically, the electrodes 613 are formed by depositing a transparent material, such as ITO, onto the surface of the element substrate 601 by, for example, sputtering or vapor deposition in a vacuum, followed by photolithography for etching. Then, Step S12 is performed.

Step S12 in FIG. 19 forms a bank 618. In Step S12, the bank 618 is formed to surround the electrodes 613 on the element substrate 601, as shown in FIG. 20B. Preferably, the material of the bank 618 is resistant to the solvents of three liquids 100R, 100G, and 100B each containing a different luminescent layer material and is capable of being turned water repellent by plasma treatment using a fluorine-based gas. For example, the bank is made of an insulating organic material, such as acrylic resin, epoxy resin, or photosensitive polyimide. For forming the bank 618, for example, a photosensitive organic material is applied onto the surface of the element substrate 601 having the electrodes 613 by roll coating or spin coating and dried into a photosensitive resin layer with a thickness of about 2 to 3 μm. Then, exposure and development are performed with the element substrate 601 opposed to a mask having openings with an area as large as the luminescent layer-forming region A at a predetermined position. Then, Step S13 is performed.

Step S13 in FIG. 19 surface-treats the luminescent layer-forming regions A. In Step S31, the surface of the element substrate 601 having the bank 618 is plasma-treated with $O_2$ gas, so that the surfaces of the electrodes 613 and the bank 618 (including the walls) are activated to be lyophilic. The surfaces are further plasma-treated with a fluorine-based gas, such as $CF_4$. Consequently, the fluorine-based gas reacts with the surface of only the bank 618 made of an organic photosensitive resin to turn the bank 618 lyophilic. Then, Step S14 is performed.

Step S14 in FIG. 19 forms hole injection/transport layers. In Step S14, first a liquid 90 containing a hole injection/transport layer material is applied to the luminescent layer-forming regions A, as shown in FIG. 20C. For applying the liquid 90, the liquid coating method of the second embodiment is performed with a liquid ejection apparatus 10 including the head unit 9 shown in FIG. 9. Droplets D of the liquid 90 ejected from the ejection heads 50 land on the electrodes 613 of the element substrate 601 and spread. A desired amount (predetermined coating amount) of the liquid 90 is ejected according to the area of the luminescent layer-forming region with small variations. Then, the liquid is dried to complete the hole injection/transport layers.

For drying, the element substrate 601 is heated by, for example, lamp annealing, to dry the solvent of the liquid 90 to remove. Thus, the hole injection/transport layers 617a are completed in the regions surrounded by the bank 618. In the present embodiment, the hole injection/transport layer may be made of 3,4-polyethylenedioxythiophene/polystyrenesulfonic acid (PEDOT/PSS). While the hole injection/transport layers 617a are formed of the same material in the luminescent layer-forming regions A in the present embodiment, the hole injection/transport layers 617a may be formed different materials depending on the materials of the luminescent layers Lu. Then, Step S15 is performed.

Step S15 in FIG. 19 forms luminescent layers. In Step S15, first three liquids 100R, 100G, and 100B each containing a different luminescent layer material are applied to the luminescent layer-forming regions A from a plurality of ejection heads 50 of the liquid ejection apparatus 10, as shown in FIG. 20D. The liquid 100R contains a material for the luminescent layer 617R (red); the liquid 100G contains a material for the luminescent layer 617G (green); and the liquid 100B contains a material for the luminescent layer 617B (blue). The liquids 100R, 100G, and 100B landed on the luminescent layer-forming regions A spread and rise hemispherically. These liquids 100R, 100G, and 100B are applied by the liquid coating method of the second embodiment. Preferably, the driving voltage (Vh1 to Vh4) of the driving signal COM is set for each of the liquids 100R, 100G, and 100B. Hence, the driving signal is set for each ejection head 50 filled with any one of the liquids 100R, 100G, and 100B.

FIGS. 21A and 21B are schematic plan views showing the liquid coating method. For ejecting the liquids 100R, 100G, and 100B in a form of droplet D, Regions A to which the same liquid is applied of the luminescent layer-forming regions A arranged in a matrix manner at a density of 200 ppi are disposed every three regions in the X direction and continuously in the Y direction (in striped manner) as shown in FIGS. 21A and 21B. Accordingly, the ejection head 50 is opposed to the element substrate 601 so as to be slanted when viewed from above so that the nozzle pitch P1 (about 141 μm) is aligned with the pitch (about 126 μm) of the luminescent layer-forming regions A to which the same liquid is applied. The ejection head 50 may be slanted in either direction. In practice, the ejection head 50 is positioned with respect to the work placed on the stage 5 by rotating the head unit 9 by the operation of the rotation mechanism 7 of the liquid ejection apparatus 10 (see FIG. 7).

In the present embodiment, three droplets D are disposed in each luminescent layer-forming region A in the following order. First, two droplets D are separately disposed at points near the ends in the Y direction of the luminescent layer-forming region A. More specifically, two droplets D1 and D2 of the first droplet group $Gr_1$ are ejected first, as shown in FIG. 21A. Subsequently, a droplet D3 of the second droplet group $Gr_2$ is ejected to fill the space between the previously disposed droplets D1 and D2, as shown in FIG. 21B. Thus, the liquid can spread evenly over the luminescent layer-forming region A. In other words, droplets D1 to D3 are disposed in a luminescent layer-forming region A with a single nozzle 52 by scanning the nozzle twice. The droplets of the first droplet group $Gr_1$ and the second droplet group $Gr_2$ are applied by applying a driving signal to the oscillator 59 of the selected nozzle 52. The driving signal is selected among the combinations of driving signals that can vary the ejection amount of droplet according to the adjustment amount determined for the luminescent layer-forming region A to eliminate the variation in coating amount. Thus, a desired amount of each of the liquids 100R, 100G, and 100B can be applied to the corresponding luminescent layer-forming region A with a small variation than the variation in ejection amount of droplet D.

More specifically, three droplets D are ejected onto a luminescent layer-forming region A through a single nozzle 5, as shown in FIG. 21A. Assume that the coating amount at this time is in section 1 shown in FIG. 15. If a reference driving signal is applied to the oscillator 59 of the nozzle 52 to eject three droplets D, the coating amount of the liquid becomes 2.7 ng short from the median of 30 ng. Accordingly, a driving signal capable of adjustment of +1 ng is selected and the selected signal is applied to the oscillator 59 twice to eject the droplets D1 and D2. The first droplet group $Gr_1$ including droplets D1 and D2 is finally +2 ng adjusted and applied to the luminescent layer-forming region. Then, a driving signal capable of adjustment of +0.7 ng is selected and the selected signal is applied to the oscillator 59 once to eject droplet D3 of the second droplet group $Gr_2$. Consequently, the coating amount of the liquid constituted of the first droplet group $Gr_1$ and the second droplet group $Gr_2$ is +2.7 ng adjusted. The droplets of the first droplet group $Gr_1$ and the droplet of the second droplet group $Gr_2$ are ejected by different sequences of scanning using driving signals COM having driving voltages selected from Vh2 to Vh4 according to the respective adjustment levels. Other nozzles 52 used for coating are of course adjusted in the same manner. Then, the coating is dried to complete the luminescent layer.

The ejected liquids 100R, 100G, and 100B are dried to remove the respective solvents, and thus the luminescent layers 617R, 617G, and 617B are formed over the surface of the hole injection/transport layers 617a in the respective luminescent layer-forming regions A, as shown in FIG. 20E. Preferably, the drying of the element substrate 601 onto which the liquids 100R, 100G, and 100B have been ejected is performed under reduced pressure. This can dry the solvent at substantially a constant vapor rate. Then, Step S16 is performed.

Step S16 in FIG. 19 forms a cathode. In Step S16, a cathode 604 is formed to cover the surfaces of the luminescent layers 617R, 617G, and 617B and the bank 618 on the element substrate 601, as shown in FIG. 20F. The cathode 604 is preferably made of a composite of a metal, such as Ca, Ba, and Al, and a fluoride, such as LiF. It is particularly preferable that the side closer to the luminescent layers 617R, 617G, and 617B is made of a material having a low work function, such as Ca, Ba, or LiF, and the other side is made of a material having a high work function, such as Al. The cathode 604 may be covered with a protective layer, such as a $SiO_2$ or SiN film. Such a protective layer can prevent the oxidation of the cathode 604. For forming the cathode 604, vapor deposition, sputtering, CVD, or the like can be applied. From the viewpoint of preventing thermal damage to the luminescent layers 617R, 617G, and 617B, the cathode 604 is preferably formed by vapor deposition.

The thus prepared element substrate 601 has luminescent layers 617R, 617G, and 617B formed by stably applying a desired amount (predetermined coating amount) of liquids 100R, 100G, and 100B in a form of droplet D1 to D3 to the respective luminescent layer-forming regions A, followed by drying to substantially the same thickness.

Since, in the present embodiment, the luminescent layer-forming regions A are closely and precisely arranged at a density of 200 ppi on the element substrate 601, the liquids 100R, 100G, and 100B can be applied in three droplets to the respective luminescent layer-forming regions A. Since the number of ejected droplets D is small, the technique of adjusting the number of droplets D cannot be applied to reduce the variation in coating amount. In addition, since the number of driving signals COM capable of varying the number of droplets D is limited, it is very useful to employ the liquid coating method of the second embodiment for ejecting the liquids 100R, 100G, and 100B, from the viewpoint of achieving highly precise adjustment using a small number of driving signals COM.

The third embodiment produces the following effects:

(1) In the method for manufacturing the light-emitting element portion 603 of the third embodiment, the liquids 100R, 100G, and 100B are ejected in a desired amount (predetermined coating amount) with a small variation to the luminescent layer-forming regions A closely and precisely arranged on the element substrate 601 by the liquid coating method of the second embodiment. The liquids 100R, 100G, and 100B are each constituted of the first droplet group $Gr_1$ including droplets D1 and D2 and the second droplet group $Gr_2$ including a droplet D3, and are stably ejected to the respective luminescent layer-forming regions A, thereby forming respective luminescent layers 617R, 617G, and 617B having substantially the same thickness after being dried.

(2) In the method for manufacturing the light-emitting element portion 603 of the third embodiment, the droplets of the first droplet group $Gr_1$ and the second droplet group $Gr_2$ are ejected to a luminescent layer-forming region A through a single nozzle 52. This reduces the number of scanning sequences in comparison with the case where the first droplet group $Gr_1$ and the second droplet group $Gr_2$ are ejected through respective nozzles 52. In addition, ejection in use of a single nozzle 52 allows the liquids 100R, 100G and 100B to be applied stably, preventing the ejection performance from varying.

(3) An organic EL device 600 manufactured through the method for manufacturing the light-emitting element portion 603 of the third embodiment has luminescent layers 617R, 617G, and 617B with substantially the same thickness, and accordingly the luminescent layers 617R, 617G, and 617B have substantially the same resistance. Consequently, the luminescent layers 617R, 617G, and 617B can emit light with reduced unevenness in emission and brightness, which result from unevenness in resistance, by applying a driving voltage to the light-emitting element portion 603 using the circuit element portion 602. Thus, an organic EL device 600 can be achieved which displays high-quality fine and precise images exhibiting more even emission and brightness.

Various modifications may be made in the above describe embodiment, as described below.

First modification: In the liquid coating method of the second embodiment, the range of the assignment of the plurality of adjustment levels is not necessarily the same as the range of variation in coating amount. For example, the range of the plurality of (for example, nine) sections may be set so that the minimum value and the maximum value in the variation in coating amount can be typical values. Thus, a more appropriate adjustment amount can be assigned to the coating region where the coating amount is the minimum or the maximum.

Second modification: In the liquid coating method of the second embodiment, a predetermined coating amount may not be the median of variations in coating amount in the frequency distribution. For example, the average of coating amounts may be used. Thus, the standard deviation whose center is the average may be used for setting the sections.

Third modification: In the liquid coating method of the second embodiment, adjustment amounts are not necessarily assigned on the basis of number of droplets of the droplet group. For example, a larger adjustment amount may be assigned to a droplet group having a larger droplet amount, and a smaller adjustment amount may be assigned to a droplet group having a smaller droplet amount. Thus, percentages of adjustments in droplet groups can be leveled on the basis of droplet amount.

Fourth modification: In the liquid coating method of the first embodiment and the liquid coating method of the second embodiment, the ejection amount and the coating amount of the liquid based on the ejection amount are not necessarily on a weight basis. For example, the volume of droplet D ejected through each nozzle 52 may be measured from an image of flying behavior of the droplet, and the volume is defined as the ejection amount. Alternatively, the volume of droplet D may be measured from the volume of the thin film formed on the substrate.

Fifth modification: In the liquid ejection apparatus 10 of the second embodiment, the form of the driving signal COM is not particularly limited. The waveform may be simply trapezoidal or rectangular, or these waveforms may be combined with an intermediate voltage in between. More specifically, the ejection amount can be varied not only by varying the driving voltage Vh of the waveform capable of varying the ejection amount of droplet D, but also by varying the slope during discharge (voltage drop) or the intermediate voltage during discharge.

Sixth modification: In the liquid ejection apparatus 10 of the second embodiment, the driving signal COM can be generated by any method without limitation. For example, a plurality of driving waveforms may be generated within an identical ejection period. More specifically, one of the plurality of waveforms may be selected within an identical ejection period.

Seventh modification: In the organic EL device forming method of the third embodiment, the light-emitting element portion 603 does not necessarily include three-color luminescent layers. For example, single color luminescent layers, such as of white, may be disposed. The liquid coating method can be applied to such a structure. Thus, the organic EL device 600 can be used as an illuminating device including a plurality of single-color organic EL elements. Organic EL elements emitting white light and at lest three color filters may be combined to display full color images. Thus, the organic EL device 600 can be used as a full-color display device.

Eighth modification: In the organic EL device manufacturing method of the third embodiment, the arrangement of the luminescent layer-forming regions A on the element substrate 601 is not limited to the form of the embodiment. For example, the luminescent layer-forming region A may be quadrate, and the luminescent layer-forming regions A to which the same liquid is applied may be arranged in a mosaic or delta manner, instead of the striped manner. The liquid coating method of the second embodiment can be applied to these arrangements.

Ninth modification: In the organic EL device manufacturing method of the third embodiment, droplets D1 to D3 disposed in a luminescent layer-forming region A are not necessarily ejected through a single nozzle 52. For example, droplets D1 to D3 may be ejected through their respective nozzles 52, or the first droplet group $Gr_1$ and the second droplet group $Gr_2$ are ejected through their respective nozzles 52. The liquid coating method of the second embodiment can be applied to these cases. Also, a plurality of droplet groups $Gr_1$ to $Gr_n$ may be ejected using the same nozzle line 52A (or 52B) or the same ejection head 50. The nozzles 50 in the same nozzle line 52A (or 52B) or the nozzles 52 in the same ejection head 50 can exhibit substantially uniform ejection performance. Since the ejection amounts of the droplets in the same droplet group ejected through the nozzles 52 exhibiting such uniform performance are adjusted, the coating amount can be uniformly and precisely adjusted over a plurality of coating regions. Hence, the variation in coating amount of the liquid can be reduced.

Tenth modification: The liquid coating method of the first embodiment can be applied to other device manufacturing methods without being limited to the organic EL device manufacturing method of the third embodiment. For example, the liquid coating method can be applied to a method for forming color filters. The color filter forming method may include ejecting droplets D of three color liquids containing respective coloring materials from the respective ejection heads 50 to the coating regions separated by the bank 618 shown in FIG. 18 through a plurality of nozzles 52; and solidifying the liquids to form three types of color layers. This color filter forming method, in which the regions to be colored are the coating regions, can form highly fine and precise color filters including three color layers. In the method, the number of liquids is not limited to three, and many colors including R (red), G (green), and B (blue) may be used. According to the number of liquids, the number of ejection heads 50 in the head unit 9 can be increased. In addition to the color filter forming method, the liquid coating method can be applied to a method for manufacturing a highly precise optical lens, using a liquid containing a lens material Furthermore, the liquid coating method can be applied to the formation of a wiring pattern having a specific shape, the formation of unpatterned solid films, such as alignment layers and insulating films, and the formation of a liquid crystal layer filled with liquid crystal as an electrooptic material.

Eleventh modification: The liquid coating method of the first embodiment is not applied only to device manufacturing methods. For example, the coating regions may not be separated by the bank (partition member) or the like. The liquid coating method can be applied to the case in which an adjusted amount of recording ink is applied as the liquid to printing regions divided on a software basis. Thus, line segments having a specific width or print surfaces having a specific area can be formed in a scanning direction with a plurality of droplet groups. Thus, the liquid coating method can be applied to the case in which a substrate or a piece of recording paper is divided into virtual coating regions by defining coating regions on a software basis.

What is claimed is:

1. A liquid coating method performed by ejecting droplets of a liquid through a plurality of nozzles to a plurality of coating regions on a substrate, the method comprising:

obtaining nozzle information including the ejection amount of a droplet of the liquid ejected through each nozzle;

producing arrangement information for disposing the liquid according to which a plurality of droplet groups each including at least one droplet of the liquid are disposed in each coating region while the plurality of nozzles and the substrate are scanned for relative movement;

performing operation to calculate the coating amount of the liquid to be applied to each coating region according to the nozzle information and the arrangement information;

dividing the variation in coating amount into a plurality of sections;

calculating the difference between a typical value of each section and a predetermined coating amount and setting the difference as the adjustment amount adjusted from the predetermined coating amount in the corresponding section:

assigning the adjustment amount of each of the sections requiring adjustment to the droplet groups so that the assigned adjustment amounts vary from one droplet group to another;

setting a plurality of driving signals for each droplet groups so that combinations of the driving signals give coating amounts that have taken the assigned adjustment amounts into account; and driving a selected nozzle with driving signals selected from the combinations to eject the liquid to each of the coating regions through the nozzle while the scanning is performed according to the arrangement information.

2. The liquid coating method according to claim 1, wherein one of the plurality of driving signals is defined as a reference driving signal, and the predetermined coating amount is obtained by multiplying a reference ejection amount of droplet ejected with the reference driving signal and the total number of droplets of the plurality of droplet groups, and wherein the nozzle information includes the ejection amounts of the plurality of nozzles driven with the reference driving signal.

3. The liquid coating method according to claim 1, wherein the arrangement information is produced so that the respective droplet groups are disposed by different sequences of the scanning.

4. The liquid coating method according to claim 3, wherein the arrangement information is produced so that the respective droplet groups are disposed using the same nozzle by the different sequences of the scanning.

5. The liquid coating method according to claim 3, wherein the arrangement information is produced so that the droplet groups are disposed by the different sequence of the scanning, using different nozzles for the respective droplet groups or the respective droplets.

6. The liquid coating method according to claim 3, wherein the plurality of nozzles define a plurality of nozzle lines and the scanning is performed so as to relatively move the nozzle lines and the substrate, and wherein the arrangement information is produced so that the respective droplet groups are disposed using the same nozzle line by different sequences of the scanning.

7. The liquid coating method according to claim 3, wherein the scanning is performed so as to relatively move a plurality of ejection heads having the plurality of nozzles and the substrate, and the arrangement information is produced so that the respective droplet groups are disposed using the same ejection head by different sequences of the scanning.

8. The liquid coating method according to claim 1, wherein the plurality of sections have the same range.

9. The liquid coating method according to claim 8, wherein the variation in coating amount is divided into sections so that the range of variations in coating amount corresponds to the range of the plurality of sections.

10. The liquid coating method according to claim 8, wherein the variation in coating amount is divided into sections so that the maximum value and the minimum value in the variation in coating amount are the typical values of the sections.

11. The liquid coating method according to claim 1, wherein the predetermined coating amount is defined by the median of the variation in coating amount, and the section including the median is selected as the target of the adjustment, thus setting the adjustment amount in each section.

12. The liquid coating method according to claim 1, wherein for assigning the adjustment amount, a plurality of adjustment levels are assigned to each droplet groups according to the combinations of the plurality of driving signals, and the plurality of adjustment levels are varied at the same intervals for each droplet group.

13. The liquid coating method according to claim 12, wherein one of the droplet groups is defined as a reference droplet group that is the reference of the adjustment, and the interval of the adjustment levels of each of the other droplet groups is twice or more of the interval of the reference droplet group.

14. The liquid coating method according to claim 13, wherein the product of the interval of the adjustment levels in the reference droplet group and the number of the adjustment levels of the reference droplet group is equal to the interval of the adjustment levels of another droplet group.

15. The liquid coating method according to claim 13, wherein the droplet group constituted of the smallest number of droplets is defined as the reference droplet group.

16. The liquid coating method according to claim 13, wherein the droplet group constituted of droplets having a smallest droplet amount is defined as the reference droplet group.

17. The liquid coating method according to claim 13, wherein the number of adjustment levels of the reference droplet group is the same as the number of adjustment levels of the other droplet groups.

18. The liquid coating method according to claim 17, wherein the number of adjustment levels of each droplet group is the same as the number of the plurality of driving signals.

19. A method for manufacturing an organic EL device including luminescent layers in a plurality of luminescent layer-forming regions separated one another on a substrate, the method comprising:
   applying a liquid containing a luminescent layer material to the luminescent layer-forming regions, the liquid being applied as a plurality of droplet groups to each luminescent layer-forming region by the liquid coating method as set forth in claim 1; and
   solidifying the applied liquid to form the luminescent layers.

20. The method according to claim 19, wherein for applying the liquid, a plurality of liquids that can produce different color emissions including red, green, and blue emissions are each applied to desired luminescent layer-forming regions so that the luminescent layers include at least red, green, and blue luminescent layers.

* * * * *